US012713762B2

(12) United States Patent
Ito et al.

(10) Patent No.: US 12,713,762 B2
(45) Date of Patent: Aug. 18, 2026

(54) ORGANIC LIGHT-EMITTING APPARATUS HAVING LIGHT-EMITTING LAYERS INCLUDING DIFFERENT MATERIAL RESPECTIVELY, AND DISPLAY APPARATUS, LIGHTING APPARATUS, ELECTRONIC APPARATUS, MOVING OBJECT, AND IMAGE-FORMING APPARATUS INCLUDING ORGANIC LIGHT-EMITTING APPARATUS

(71) Applicant: CANON KABUSHIKI KAISHA, Tokyo (JP)

(72) Inventors: Kentaro Ito, Tokyo (JP); Yosuke Nishide, Kanagawa (JP); Eisuke Gommori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 18/483,096

(22) Filed: Oct. 9, 2023

(65) Prior Publication Data

US 2024/0147750 A1 May 2, 2024

(30) Foreign Application Priority Data

Oct. 13, 2022 (JP) ................................ 2022-164886
Jul. 3, 2023 (JP) ................................ 2023-109523

(51) Int. Cl.

| | |
|---|---|
| ***H10K 50/13*** | (2023.01) |
| ***F21S 43/145*** | (2018.01) |
| ***G02B 27/01*** | (2006.01) |
| ***H04N 23/53*** | (2023.01) |
| ***H10K 50/852*** | (2023.01) |

(Continued)

(52) U.S. Cl.
CPC .......... *H10K 50/131* (2023.02); *F21S 43/145* (2018.01); *G02B 27/0172* (2013.01); *H04N 23/53* (2023.01); *H10K 50/852* (2023.02); *H10K 50/858* (2023.02); *F21V 3/00* (2013.01); *F21V 9/08* (2013.01); *F21W 2103/35* (2018.01); *F21Y 2115/15* (2016.08); *G02B 2027/0178* (2013.01); *H10K 2101/25* (2023.02)

(58) Field of Classification Search
None
See application file for complete search history.

(56) References Cited

U.S. PATENT DOCUMENTS

| | | | |
|---|---|---|---|
| 2015/0188087 | A1 | 7/2015 | Lee |
| 2022/0045294 | A1 | 2/2022 | Weaver et al. |
| 2022/0052274 | A1 | 2/2022 | Jeong et al. |

FOREIGN PATENT DOCUMENTS

| | | | |
|---|---|---|---|
| CN | 109494310 A * | 3/2019 | ............. H10K 59/38 |
| CN | 119546054 B * | 9/2025 | ............. G09F 9/335 |

(Continued)

*Primary Examiner* — Hung K Vu
(74) *Attorney, Agent, or Firm* — Canon U.S.A., Inc. IP Division

(57) ABSTRACT

An organic light-emitting device includes, in the following order, a first electrode, a first light-emitting layer, a charge generation layer, a second light-emitting layer, and a second electrode. The first light-emitting layer contains a first light-emitting material. The second light-emitting layer contains a second light-emitting material. Each of the first light-emitting material and the second light-emitting material emits light of a first color. The first light-emitting material and the second light-emitting material are different.

23 Claims, 10 Drawing Sheets

(51) Int. Cl.

| | |
|---|---|
| ***H10K 50/858*** | (2023.01) |
| *F21V 3/00* | (2015.01) |
| *F21V 9/08* | (2018.01) |
| *F21W 103/35* | (2018.01) |
| *F21Y 115/15* | (2016.01) |
| *H10K 101/25* | (2023.01) |

(56) References Cited

FOREIGN PATENT DOCUMENTS

| | | | | | |
|---|---|---|---|---|---|
| JP | 2022054321 A | * | 4/2022 | ........... | H10K 59/352 |
| JP | 2022117963 A | | 8/2022 | | |

* cited by examiner

ORGANIC LIGHT-EMITTING APPARATUS HAVING LIGHT-EMITTING LAYERS INCLUDING DIFFERENT MATERIAL RESPECTIVELY, AND DISPLAY APPARATUS, LIGHTING APPARATUS, ELECTRONIC APPARATUS, MOVING OBJECT, AND IMAGE-FORMING APPARATUS INCLUDING ORGANIC LIGHT-EMITTING APPARATUS

BACKGROUND OF THE INVENTION

Technical Field of the Invention

One disclosed aspect of the embodiments relates to an organic light-emitting apparatus, and a display apparatus, a lighting apparatus, an electronic apparatus, a moving object, and an image-forming apparatus including the organic light-emitting apparatus.

Description of the Related Art

An organic light-emitting device (hereinafter, also referred to as an "OLED") is configured to emit light by energizing an anode, a cathode, and organic electroluminescent (EL) layers including a light-emitting layer disposed between those electrodes. Organic light-emitting devices have been used in various display apparatuses because of their characteristics, such as a high degree of freedom in shape, light weight, and high color rendering properties, compared with display apparatuses in the past. Organic light-emitting devices have been actively developed for use in further application products. Organic light-emitting devices, however, have been known to be less likely to provide high luminance, compared with display apparatuses in the past. There is a need for technology to achieve high luminance.

U.S. Patent Application Publication No. 2015/0188087 discloses an organic light-emitting device including two light-emitting layers disposed between an anode and a cathode. It is disclosed that the two light-emitting layers of the organic light-emitting device have the same emission color, and that this organic light-emitting device has higher luminance than a configuration having one light-emitting layer.

U.S. Patent Application Publication No. 2015/0188087 describes a structure having two light-emitting layers. However, when two light-emitting layers are provided, there is room for improvement with respect to the difference in light-emitting position between the two light-emitting layers, such as the influence of the light-emitting layer adjacent to the anode and the light-emitting layer adjacent to the cathode on the viewing angle.

SUMMARY OF THE INVENTION

An aspect of the embodiments has been accomplished in light of the above circumstances and provides an organic light-emitting device including two light-emitting layers configured to emit light of a first color and having excellent light emission characteristics. One aspect of the embodiments is directed to providing an organic light-emitting device including, in the following order, a first electrode, a first light-emitting layer, a charge generation layer, a second light-emitting layer, and a second electrode. The first light-emitting layer contains a first light-emitting material. The second light-emitting layer contains a second light-emitting material. The charge generation layer contains an organic compound having a lowest unoccupied molecular orbital energy level lower than a highest occupied molecular orbital energy level of the second light-emitting layer. Each of the first light-emitting material and the second light-emitting material emits light of a first color. The first light-emitting material and the second light-emitting material are different.

Further features of the disclosure will become apparent from the following description of exemplary embodiments with reference to the attached drawings.

DESCRIPTION OF THE EMBODIMENTS

Figure 1A:
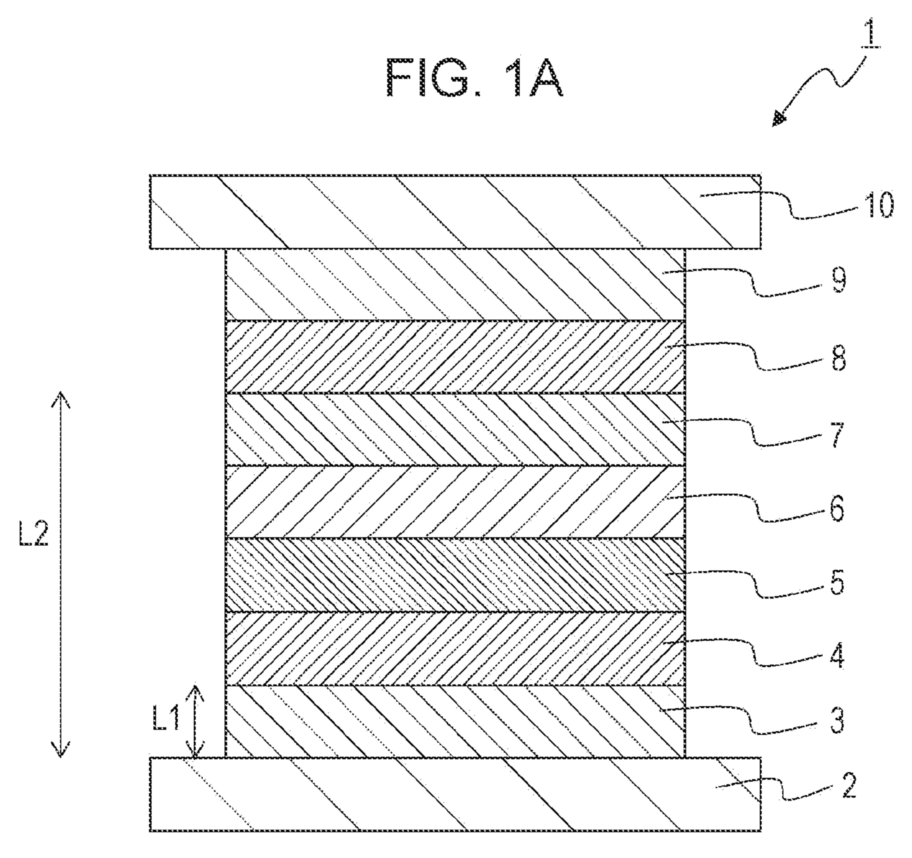
FIG. 1A is a schematic cross-sectional view of an organic light-emitting device according to an embodiment.

An organic light-emitting device according to an embodiment includes, in the following order, a first electrode, a first light-emitting layer, a charge generation layer, a second light-emitting layer, and a second electrode. The first light-emitting layer contains a first light-emitting material. The second light-emitting layer contains a second light-emitting material. Each of the first light-emitting material and the second light-emitting material emits light of a first color. The first light-emitting material and the second light-emitting material are different.

When the first light-emitting material and the second light-emitting material are different from each other, appropriate light-emitting materials can be selected for the first light-emitting layer and the second light-emitting layer. The reason why the appropriate light-emitting material is different in each of the first light-emitting layer and the second light-emitting layer is that the position of the first light-emitting layer and the position of the second light-emitting layer are different, and thus conditions, such as viewing angle and optical interference, are different. In the organic light-emitting device according to an embodiment, light-emitting materials appropriate for the conditions can be selected, thus providing the organic light-emitting device having excellent light emission characteristics.

In the organic light-emitting device according to an embodiment, the full width at half maximum of the photoluminescence (hereinafter, also referred to as "PL") spectrum of the first light-emitting material and the full width at half maximum of the PL spectrum of the second light-emitting material may be different. The full width at half maximum of the PL spectrum of the first light-emitting material may be larger than the full width at half maximum of the PL spectrum of the second light-emitting material.

In the case where the first light-emitting layer is disposed on the reflective electrode side, the second light-emitting layer is disposed on the outgoing light side, and where the full width at half maximum of the PL spectrum of the first light-emitting material is larger than the full width at half maximum of the PL spectrum of the second light-emitting material, when the direction perpendicular to the main surface of the substrate on which the organic light-emitting device is disposed is defined as 0°, a decrease in luminance when the organic light-emitting device is observed from an angle θ can be reduced to improve viewing angle characteristics.

In the organic light-emitting device according to an embodiment, the full width at half maximum of the PL spectrum of the first light-emitting material may be smaller than the full width at half maximum of the PL spectrum of the second light-emitting material. In the case where the first light-emitting layer is disposed on the reflective electrode side, the second light-emitting layer is disposed on the outgoing light side, and where the full width at half maximum of the PL spectrum of the first light-emitting material is smaller than the full width at half maximum of the PL spectrum of the second light-emitting material, the second light-emitting layer has a greater effect of narrowing the spectrum band due to the optical interference between the light-emitting layer and the reflective electrode than the first light-emitting layer. Thus, the full width at half maximum of the spectrum extracted from the second light-emitting layer can approach the full width at half maximum of the spectrum extracted from the first light-emitting layer to improve the color purity. The use of optical interference is also effective in increasing the light extraction efficiency.

The difference in the full width at half maximum of the PL spectrum between the first light-emitting material and the second light-emitting material may be 15 nm or more, preferably 30 nm or more, more preferably 50 nm or more. In order not to deteriorate the color purity, the difference may be 90 nm or less, preferably 30 nm or less.

In the organic light-emitting device according to an embodiment, each of the first light-emitting layer and the second light-emitting layer emits light of the first color. The first light-emitting layer emits light means that the first light-emitting material in the first light-emitting layer emits light. The same applies to the second light emitting layer. The difference in wavelength between the maximum intensity peak of the emission spectrum of the first light-emitting material and the maximum intensity peak of the emission spectrum of the second light-emitting material may be within 30 nm, within 15 nm, or within 5 nm. When the difference is within the 30 nm, both layers may be considered to emit the first color.

In the organic light-emitting device according to an embodiment, the orthogonal projection of the second light-emitting layer on the first electrode may be larger than the orthogonal projection of the first light-emitting layer on the first electrode. It can also be said that the area of the second light-emitting layer is larger than the area of the first light-emitting layer in plan view. When the light extraction efficiency is improved by using an optical member or the like, the area of the light-emitting layer on the outgoing light side may be large.

The organic light-emitting device according to an embodiment may further include a lens on which light emitted from the first light-emitting layer is incident, in which the second light-emitting layer may be disposed between the lens and the first light-emitting layer. When the second light-emitting layer is located on the outgoing light side, an increase in the area of the light-emitting layer close to an optical member, such as a lens, enables the light-emitting layer to emit light to be incident on the lens with high efficiency. That is, light that does not enter the lens can be reduced. The configuration in which the second light-emitting layer is disposed on the outgoing light side can also be referred to as a configuration in which the second light-emitting layer is disposed between the lens and the first light-emitting layer. An example of the device including the first light-emitting layer and the second light-emitting layer has been described in the above description. However, a configuration having three or more light-emitting layers may be used. When the device includes three or more light-emitting layers, the light-emitting layer closer to the light extraction side may have a larger area.

The charge generation layer of the organic light-emitting device according to an embodiment may contain an organic compound having a lowest unoccupied molecular orbital energy level lower than the highest occupied molecular orbital energy level of the second light-emitting layer.

The charge generation layer may contain a compound having a lowest unoccupied molecular orbital energy level of less than −5.0 eV. Specific examples thereof include hexaazatriphenylene, radialene compounds, and tetracyanoquinodimethane.

First Embodiment

FIG. 1A is a schematic cross-sectional view of an organic light-emitting device according to an embodiment. An organic light-emitting device 1 includes, over the insulating layer, a first electrode 2, a first hole transport layer 3, a first light-emitting layer 4, a first electron transport layer 5, a charge generation layer 6, a second hole transport layer 7, a second light-emitting layer 8, a second electron transport layer 9, and a second electrode 10. Both the first light-emitting layer and the second light-emitting layer are light-emitting layers configured to emit light of a first color. The first light-emitting layer contains a first light-emitting material. The second light-emitting layer contains a second light-emitting material. The first light-emitting material and the second light-emitting material are different materials. The first hole transport layer 3, the first light-emitting layer 4, and the first electron transport layer 5 are collectively referred to as a first organic compound layer. The second hole transport layer 7, the second light-emitting layer 8, and the second electron transport layer 9 are collectively referred to as a second organic compound layer. The first light-emitting layer 4 may contain a first organic compound as a host material. The first light-emitting layer 4 may be composed only of the first organic compound and the first light-emitting material. Similarly, the second light-emitting layer 8 may contain a second organic compound as a host material.

The second light-emitting layer 8 may be composed only of the second organic compound and the second light-emitting material.

The organic light-emitting device according to the present embodiment has an optical resonator structure. The distance between the first light-emitting layer and the first electrode is a distance L1 for intensifying light emitted from the first light-emitting layer. The distance between the second light-emitting layer and the first electrode is a distance L2 for intensifying light emitted from the second light-emitting layer. In the present embodiment, L1 and L2 are distances between the first electrode and the interfaces of the light-emitting layers adjacent to the first electrode. In consideration of the materials contained in the light-emitting layers, the interfaces of the light-emitting layers adjacent to the second electrode may be the starting points of the distances. Specifically, in the case of an electron-trap type, the interfaces of the light-emitting layers adjacent to the cathode may be the end portions of the optical interference distances. Light-emitting points may be used as the starting points of the distances. Although not particularly limited, the optical interference distance of the first light-emitting layer and the optical interference distance of the second light-emitting layer may be differ in order of interference by 1. Specifically, the optical interference distance of the first light-emitting layer may be $\lambda_1/4$, and the optical interference distance of the second light-emitting layer may be $3\lambda_2/4$. Here, $\lambda_1$ is the wavelength of light emitted from the first light-emitting layer, and $\lambda_2$ is the wavelength of light emitted from the second light-emitting layer. An optical distance for intensifying light emitted from the first light-emitting layer is also referred to as a "first optical distance", and an optical distance for intensifying light emitted from the second light-emitting layer is also referred to as a "second optical distance".

Figure 1B:
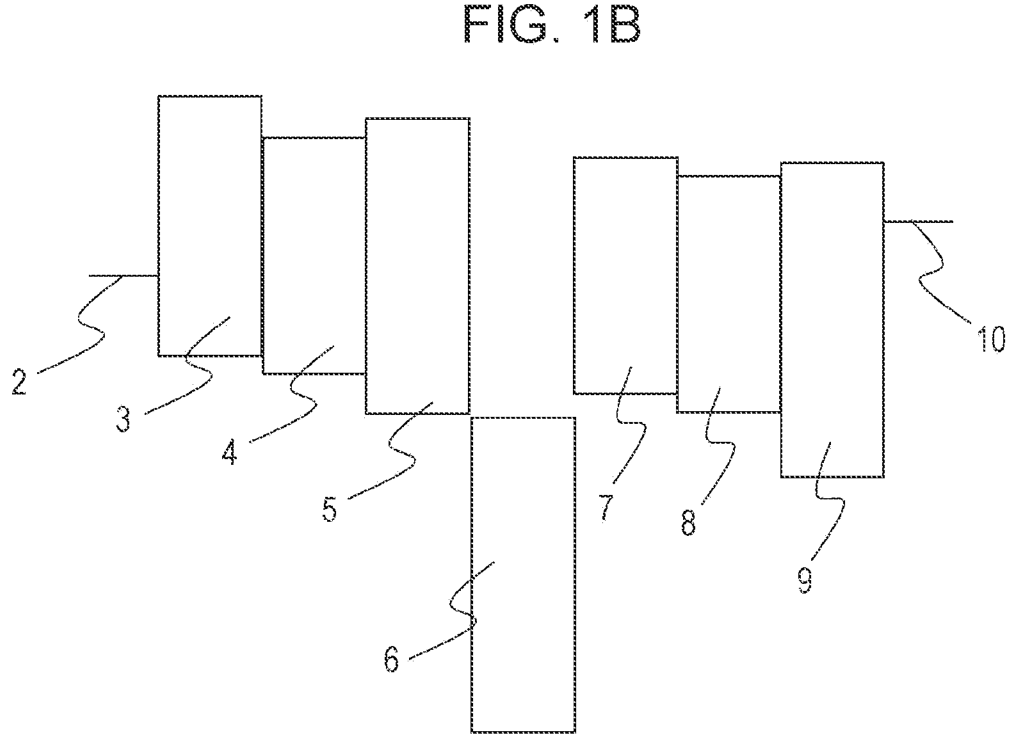
FIG. 1B is an example of an energy diagram of an organic light-emitting device according to an embodiment.

FIG. 1B illustrates an example of an energy diagram of an organic light-emitting device according to an embodiment. In the present embodiment, an example is described in which the first electrode is an anode. Reference numerals 2 to 10 denote constituent elements illustrated in FIG. 1A. The first light-emitting layer 4 is represented by a rectangular figure. The upper side represents the lowest unoccupied molecular orbital (LUMO) energy level and the lower side represents the highest occupied molecular orbital (HOMO) energy level.

The HOMO level of the first electron transport layer is lower than the HOMO level of the first light-emitting layer. This is to block holes injected into the first light-emitting layer from escaping to the second electrode side. The HOMO level of the second electron transport layer is lower than the HOMO level of the second light-emitting layer. This is also to block the holes injected into the second light-emitting layer from escaping to the second electrode side. Here, the difference between the HOMO level of the second light-emitting layer and the HOMO level of the second electron transport layer may be larger than the difference between the HOMO level of the first light-emitting layer and the HOMO level of the first electron transport layer. Holes passing through the second light-emitting layer reach the second electrode. Holes can be prevented from reaching the second electrode in order to contribute to light emission. Thus, the difference between the HOMO level of the second light-emitting layer and the HOMO level of the second electron transport layer can be large. Even if holes escape from the first light-emitting layer to the second electrode side, the holes may contribute to light emission because the second light-emitting layer is present before the holes reach the second electrode.

The LUMO level of the first hole transport layer is higher than the LUMO level of the first light-emitting layer. This is to block electrons injected into the first light-emitting layer from escaping to the first electrode side. The LUMO level of the second hole transport layer is higher than the LUMO level of the second light-emitting layer. This is also to block the electrons injected into the second light-emitting layer from escaping to the first electrode side. Here, the difference between the LUMO level of the first light-emitting layer and the LUMO level of the first electron transport layer may be larger than the difference between the LUMO level of the second light-emitting layer and the LUMO level of the second electron transport layer. Electrons passing through the first light-emitting layer reach the first electrode. Electrons can be prevented from reaching the first electrode in order to contribute to light emission. Thus, the difference between the HOMO level of the first light-emitting layer and the HOMO level of the first electron transport layer can be large.

In the present embodiment, the relationship between the first light-emitting layer and the second light-emitting layer is described. The structure may include three or more light-emitting layers between the first electrode and the second electrode. When three or more light-emitting layers are provided, the difference between the LUMO level of the light-emitting layer closest to the anode and the LUMO level of the hole transport layer closest to the anode can be larger than the difference between the LUMO level of another light-emitting layer and the LUMO level of the hole transport layer adjacent thereto. Similarly, the difference between the HOMO level of the light-emitting layer closest to the cathode and the HOMO level of the electron transport layer closest to the cathode can be larger than the difference between the HOMO level of another light-emitting layer and the HOMO level of the electron transport layer adjacent thereto. The reason for this is to make it difficult for charges to reach the electrodes.

The organic light-emitting device according to the present embodiment includes the first and second light-emitting layers configured to emit light of the first color, and thus has excellent light emission characteristics.

Second Embodiment

Figure 2:
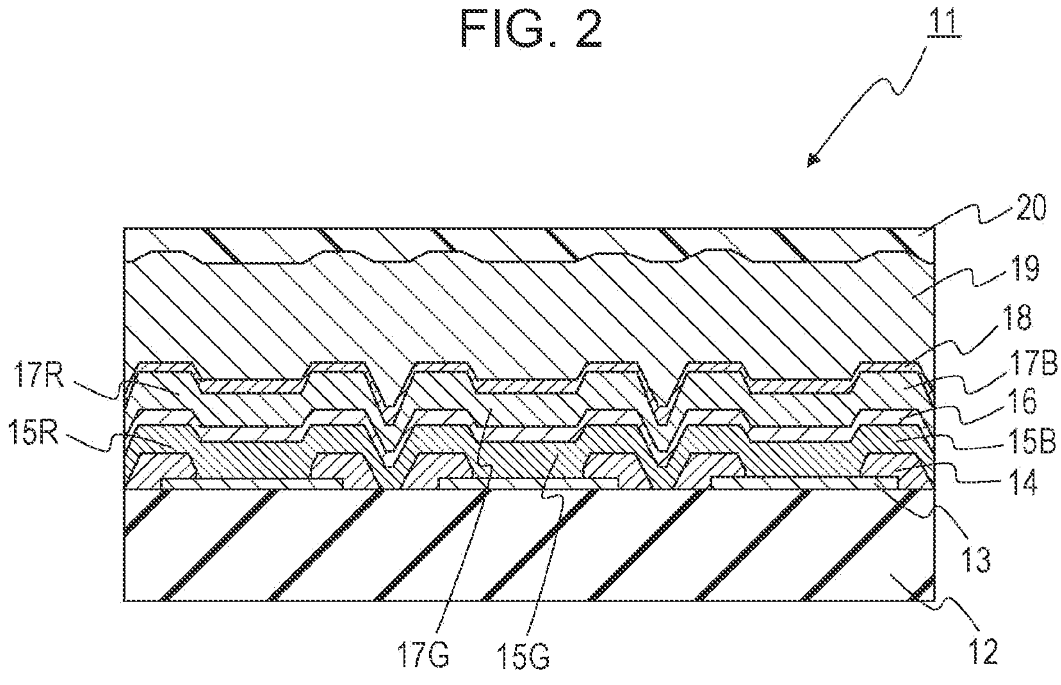
FIG. 2 is a schematic cross-sectional view of an organic light-emitting apparatus according to an embodiment.

FIG. 2 is a schematic cross-sectional view of an organic light-emitting apparatus according to the present embodiment. An organic light-emitting apparatus 11 includes a first organic light-emitting device B, a second organic light-emitting device G, and a third organic light-emitting device R. The first color of light emitted from the first organic light-emitting device may be blue, the second color of light emitted from the second organic light-emitting device may be green, and the third color of light emitted from the third organic light-emitting device may be red. The first organic light-emitting device B includes an insulating layer-containing substrate 12 and includes, over a main surface of the insulating layer, a first electrode 13, a pixel separation layer 14 covering an end portion of the first electrode, a first organic compound layer 15B in contact with the first electrode, a charge generation layer 16, a second organic compound layer 17B, a second electrode 18, a protective layer 19, and a resin layer 20.

The first organic light-emitting device B includes the first organic compound layer 15B and the second organic compound layer 17B. The first organic compound layer 15B includes the first light-emitting layer. The second organic compound layer 17B includes second light-emitting layer. Each of the first light-emitting layer and the second organic compound layer emits a first color. The second organic light-emitting device G includes a third electrode, a first organic compound layer 15G, a second charge generation layer, a second organic compound layer 17G and a fourth electrode. The fourth electrode is integral with the second electrode. The second charge generation layer is integral with the first charge generation layer. The first organic compound layer 15G includes a third light-emitting layer. The second organic compound layer 17G includes a fourth light-emitting layer. Each of the third light-emitting layer and the fourth light-emitting layer emits light of a second color. The second color is a different color from the first color. The third light-emitting layer contains a third light-emitting material. The fourth light-emitting layer contains a fourth light-emitting material. The second charge generation layer contains the second organic compound having a highest occupied molecular orbital energy level lower than the fourth light-emitting layer. The third light-emitting material and the fourth light-emitting material may be different light-emitting materials. The third organic light-emitting device R includes a fifth electrode, a first organic compound layer 15R, a third charge generation layer, a second organic compound layer 17R, and a sixth electrode. The sixth electrode is integral with the second electrode. The third charge generation layer is integral with the first charge generation layer. The first organic compound layer 15R includes a fifth light-emitting layer. The second organic compound layer 17R includes a sixth light-emitting layer. Each of the fifth light-emitting layer and the sixth light-emitting layer emits light of a third color. The third color is different from both the first color and the second color. The fifth light-emitting layer contains a fifth light-emitting material. The sixth light-emitting layer contains a sixth light-emitting material. The fifth light-emitting material and the sixth light-emitting material may be different light-emitting materials. Although the two light-emitting layers of each organic light-emitting device contain different light-emitting materials in the present embodiment, the two light-emitting layers may contain the same light-emitting material.

With respect to a color combination, any two organic light-emitting devices may each include two light-emitting layers containing different materials. Regarding the remaining one color, the two light-emitting layers may contain the same light-emitting material.

The first organic compound layer and the second organic compound layer contained in the organic light-emitting apparatus according to the present embodiment may be composed of the same materials, except for the light-emitting layers. That is, the light-emitting layers may be different for each organic light-emitting device, and the charge transport layers, such as the hole transport layers, may be shared by the organic light-emitting devices. Not all the charge transport layers need be shared, but some charge transport layers may be shared. The optical interference distance of each light-emitting layer may be adjusted by the thickness of the charge transport layer.

The light-emitting layers may have different thicknesses. That is, the thickness of the first light-emitting layer may be different from the thickness of the second light-emitting layer. This is because it is easy to optimize the thickness according to each arrangement or each material of the light-emitting layers. The thickness of the first light-emitting layer may be the same as the thickness of the second light-emitting layer.

The first light-emitting layer, the third light-emitting layer, and the fifth light-emitting layer may have different thicknesses. That is, the thickness may be determined in accordance with the emission color.

The first to sixth light-emitting layers may have different thicknesses. This is because it is easy to optimize the thickness according to each arrangement or each material of the light-emitting layers.

The first, third, and fifth electrodes of the organic light-emitting apparatus according to the present embodiment may be electrodes through which currents flow individually. The second electrode of the organic light-emitting device according to the present embodiment is shared by the other organic light-emitting devices. Alternatively, the second, fourth, and sixth electrodes may be electrodes through which currents flow individually.

In the organic light-emitting apparatus according to the present embodiment, the orthogonal projection of the second light-emitting layer on the first electrode may be larger than the orthogonal projection of the first light-emitting layer on the first electrode. Since the second light-emitting layer is located on the outgoing light side, the second light-emitting layer may be larger than the first light-emitting layer in plan view. If the outgoing light side is opposite to that of the organic light-emitting device according to the present embodiment, the magnitude relationship may be reversed. That is, the orthogonal projection of the first light-emitting layer on the first electrode may be larger than the orthogonal projection of the second light-emitting layer on the first electrode.

In the organic light-emitting device according to the present embodiment, the first light-emitting material contained in the first light-emitting layer may be a thermally activated delayed fluorescence material. This is because the first electrode is electrically coupled to a driving circuit (not illustrated), and heat generated by the driving circuit can be effectively used by the first light-emitting material. The other light-emitting devices may also contain a thermally activated delayed fluorescence material in the light-emitting layer on the first electrode side.

The organic light-emitting apparatus according to the present embodiment includes the first organic light-emitting device, a second organic light-emitting device, and a third organic light-emitting device, and each organic light-emitting device includes the two light-emitting layers and contains different light-emitting materials. Thus, the organic light-emitting apparatus has excellent light emission characteristics.

Third Embodiment

Figure 3:
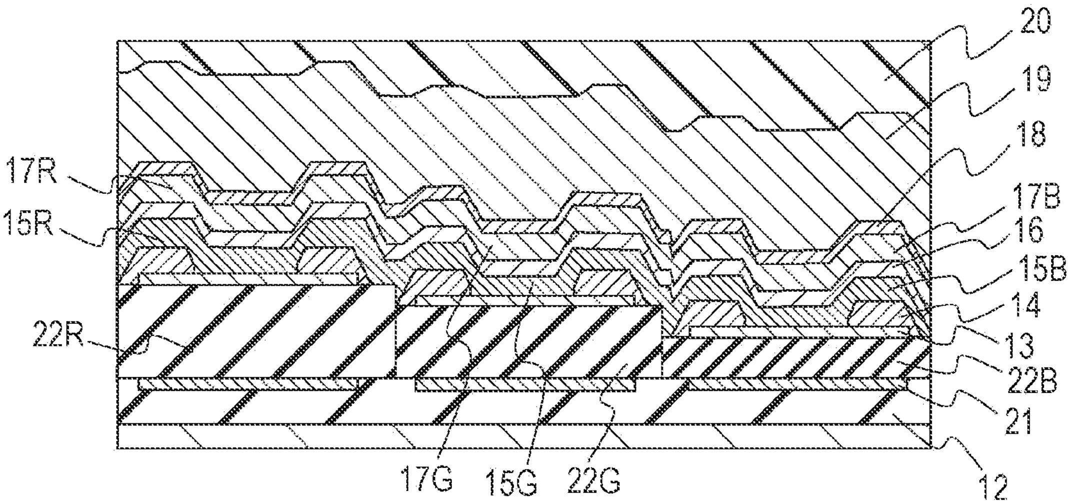
FIG. 3 is a schematic cross-sectional view of an organic light-emitting apparatus having an optical interference structure according to an embodiment.

FIG. 3 is a schematic cross-sectional view of an organic light-emitting apparatus according to the present embodiment. The organic light-emitting apparatus according to the present embodiment has the same configuration as the organic light-emitting apparatus according to the second embodiment, except that different optical interference structures are used for different emission colors. In the present embodiment, the first electrode 13 is a transparent electrode.

In the organic light-emitting apparatus according to the present embodiment, the charge transport layers of the organic compound layer 15 may be shared as common layers by the light-emitting devices. The charge transport layers are common layers and thus need not be formed for each organic light-emitting device. Since the optical interference structure adjusted for each light-emitting device is provided while ensuring the simplicity of production, the light-emitting apparatus is excellent in light emission characteristics.

The optical interference structure according to the present embodiment includes an insulating layer 22 and a reflective layer 21 between the first electrode 13 and the substrate. The insulating layer 22 has a different thickness for each emission color, and an insulating layer 22B is disposed immediately below the light-emitting layer configured to emit blue light. Similarly, insulating layers 22G and 22R are disposed immediately below the light-emitting layers configured to emit green light and red light, respectively. The insulating layer 22B is thinner than the insulating layers 22G and 22R. Blue-color light has a shorter wavelength than green-color light and red-color light and thus a shorter optical interference distance. For this reason, the insulating layer 22B in the present embodiment is thinner than the insulating layers 22G and 22R. Regarding the relationship between the thickness and the wavelength, the magnitude relationship is the same when their orders of interference are matched, but this is not the case when the orders are not matched. For example, in the case where the thickness of the insulating layer for blue is adjusted to a distance of the second order of interference, i.e., $3\lambda/4$, and the thickness of the insulating layer for green is adjusted to a distance of the first order of interference, i.e., $\lambda/4$, the relationship between the thicknesses of the insulating layers is reversed from the above example.

The optical interference distance can be estimated using the refractive index of the insulating layer. Although the refractive index is known to vary slightly in accordance with a method for forming the insulating layer, the refractive index may be estimated by specifying a substance and using a typical refractive index and a physical length of the substance.

The organic light-emitting apparatus according to the present embodiment has the optical interference structure adjusted for each emission color while using the charge transport layer as a common layer, and thus has excellent light emission characteristics.

Fourth Embodiment

Figure 4A:
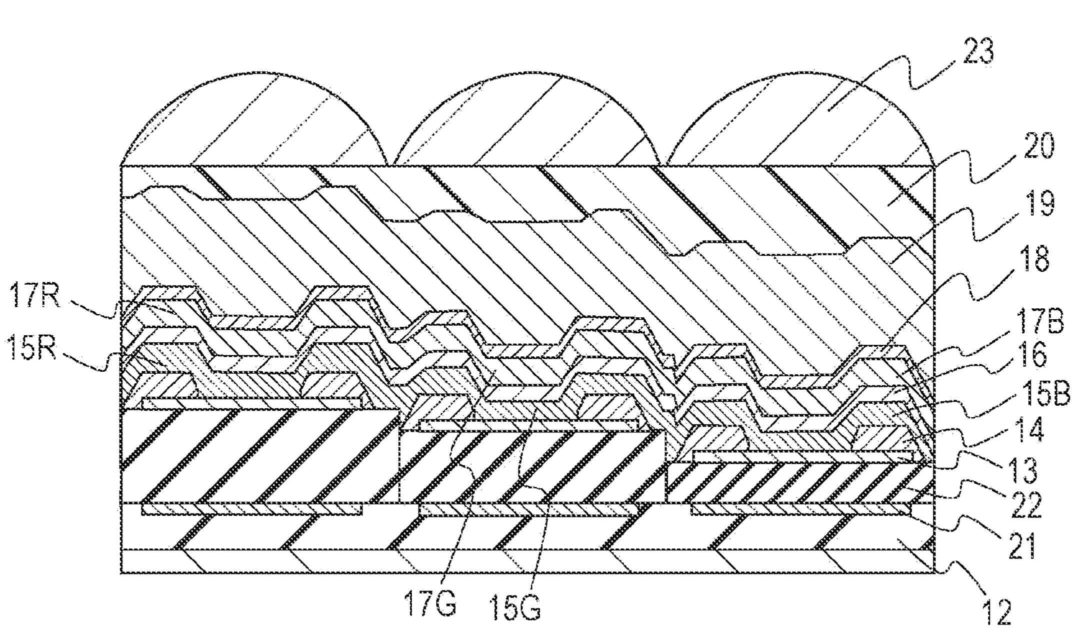
FIG. 4A is a schematic cross-sectional view of an organic light-emitting apparatus including lenses according to an embodiment.
Figure 4B:
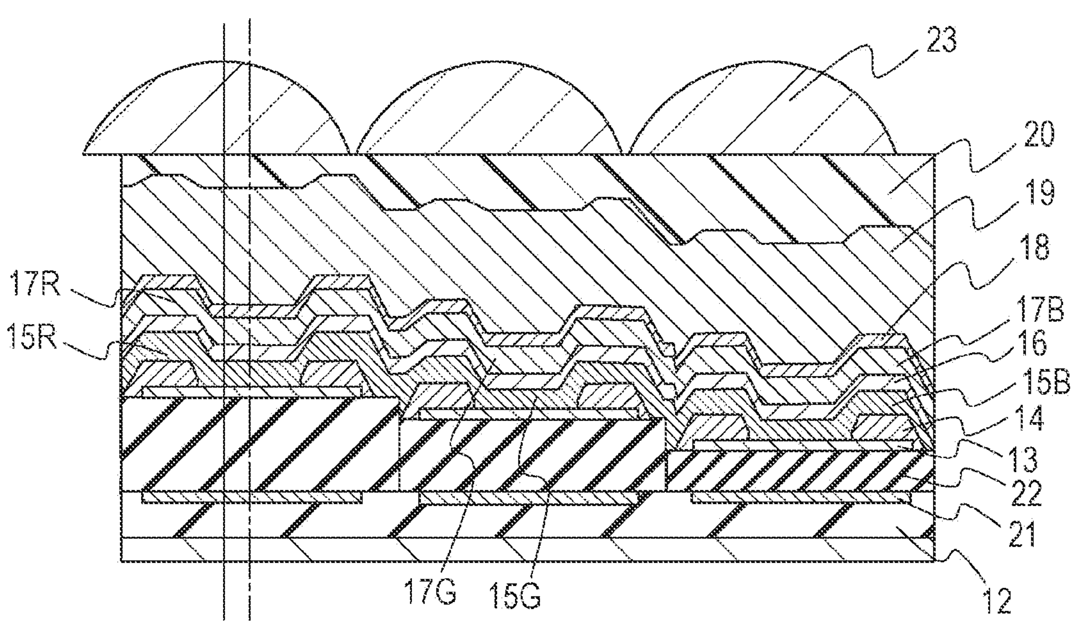
FIG. 4B is a schematic cross-sectional view of an organic light-emitting apparatus and illustrates a modification example of the arrangement positions of lenses.

FIGS. 4A and 4B are schematic cross-sectional views of organic light-emitting apparatuses according to the present embodiment. In FIG. 4A, the organic light-emitting apparatus according to the present embodiment includes, in addition to the organic light-emitting apparatus according to the third embodiment, lenses 23 disposed on the light extraction side of the organic light-emitting apparatus according to the third embodiment. The first organic light-emitting device includes a first lens, and second organic light-emitting device different from the first organic light-emitting element includes a second lens.

These lenses are arranged in such a manner that the second light-emitting layer is disposed between the first lens and the first light-emitting layer and that the fourth light-emitting layer is disposed between the second lens and the third light-emitting layer.

In the present embodiment, the lenses are disposed in such a manner that the convex portions of the lenses face the light extraction side of the organic light-emitting apparatus. However, the lenses may be disposed in such a manner that the convex portions of the lenses face the direction of the substrate. In the present embodiment, the lenses having the convex portions facing the light extraction side can also be referred to as lenses having the convex portions facing the side opposite to the substrate.

The organic light-emitting apparatus according to the present embodiment includes the optical members, such as the lenses 23 and thus can have increased luminance at a specific angle with respect to the organic light-emitting apparatus. The organic light-emitting apparatus illustrated in FIG. 4A can have increased luminance in the front direction with the lenses 23. The front direction can be referred to as a direction perpendicular to the substrate. The optical interference structure described in the third embodiment is combined; thus, the front luminance is further increased.

FIG. 4B illustrates a modification example of the lens arrangement of an organic light-emitting apparatus. In the present embodiment, each lens 23 is disposed in such a manner that the vertex of the lens does not coincide with the midpoint of the first electrode. Here, the midpoint is the midpoint of a region of the first electrode 13 that is not covered with the pixel separation layer 14 in the cross-sectional view. A dotted line in FIG. 4B indicates the midpoint of the first electrode. A solid line next to the dotted line indicates the position of the vertex of the lens. As indicated by the dotted line and the solid line, the midpoint of the first electrode and the vertex of the lens are on different lines. Being on different lines can be rephrased as being at different positions when the organic light-emitting apparatus is viewed in plan view.

The organic light-emitting apparatus according to the present embodiment may have a configuration such that in a cross section perpendicular to a surface of the first electrode in contact with the first organic compound layer, the midpoint of the third electrode of the second organic light-emitting device does not coincide with the vertex of the second lens in plan view, and the distance between the midpoint of the first electrode of the organic light-emitting device and the vertex of the first lens is different from the distance between the midpoint of the third electrode and the vertex of the second lens. The first organic compound layer includes the first light-emitting layer. The distance between the midpoint of the first electrode or the third electrode and the vertex of the corresponding lens is adjusted for each organic light-emitting device. Thereby, the direction of light emission of the organic light-emitting apparatus is adjusted and thus can be adjusted in accordance with the use of the display apparatus in consideration of the position with respect to other members. Specifically, this is effective in using a unit configured to further concentrate light emitted from the organic light-emitting apparatus.

The organic light-emitting apparatus according to the present embodiment may have a configuration such that the orthogonal projection of the second light-emitting layer on the first electrode is larger than the orthogonal projection of the first light-emitting layer on the first electrode. The second light-emitting layer is disposed between the lens and the first light-emitting layer and thus may be larger than the first light-emitting layer in plan view. If the lenses are located on a side opposite to the organic light-emitting device according to the present embodiment, the magnitude relationship may be reversed. That is, the orthogonal projection of the first light-emitting layer on the first electrode may be larger than the orthogonal projection of the second light-emitting layer on the first electrode.

In the organic light-emitting apparatus illustrated in FIG. 4B, the midpoint of the first electrode and the vertex of the lens are on different straight lines; thus, it is possible to increase the luminance in a direction inclined with respect to the front of the organic light-emitting apparatus. In the case of increasing the luminance in the inclined direction, it is useful when there is another light-collecting member or the like ahead.

The organic light-emitting apparatus according to the present embodiment includes the lenses and thus can have increased luminance at a specific angle with respect to the organic light-emitting apparatus.

Fifth Embodiment

In an organic light-emitting device according to a fifth embodiment, the first light-emitting layer includes a fifth light-emitting layer and a sixth light-emitting layer in contact with the fifth light-emitting layer, and the second light-emitting layer includes a seventh light-emitting layer and an eighth light-emitting layer in contact with the seventh light-emitting layer. The sixth light-emitting layer may be stacked on the fifth light-emitting layer. The term "stacked" used here indicates that the sixth light-emitting layer covers the fifth light-emitting layer and the sixth light-emitting layer is disposed between the fifth light-emitting layer and the second electrode. Similarly, the eighth light-emitting layer may be stacked on the seventh light-emitting layer.

The fifth light-emitting layer contains a fifth light-emitting material, and the sixth light-emitting layer contains a sixth light-emitting material different from the fifth light-emitting material. The seventh light-emitting layer contains a seventh light-emitting material, and the eighth light-emitting layer contains an eighth light-emitting material different from the seventh light-emitting material.

In the present embodiment, the fact that the light-emitting material in the first light-emitting layer is different from the light-emitting material in the second light-emitting layer indicates that the combination of the fifth light-emitting material and the sixth light-emitting material is different from the combination of the seventh light-emitting material and the eighth light-emitting material. That is, even if the fifth light-emitting material and the seventh light-emitting material are the same material, when the sixth light-emitting material and the eighth light-emitting material are different light-emitting materials, the combination of the light-emitting materials is not the same, and thus the combination of the light-emitting materials is different.

In the organic light-emitting device according to the present embodiment, the first light-emitting layer contains a first light-emitting material group composed of the fifth light-emitting material and the sixth light-emitting material, the second light-emitting layer contains a second light-emitting material group composed of the seventh light-emitting material and the eighth light-emitting material, and the first light-emitting material group and the second light-emitting material group have different combinations.

Each of the fifth to eighth light-emitting layers may contain a host material. These host materials may be the same or different from each other. The host material of the fifth light-emitting layer may be a fifth organic compound. The host material of the eighth light-emitting layer is an eighth organic compound. The same applies to the host materials in the sixth and seventh light-emitting layers.

The above configurations in the foregoing embodiments may be used in combination. For example, the lenses used in the fourth embodiment may be provided in the organic light-emitting device according to the second embodiment. That is, the organic light-emitting apparatus illustrated in FIG. 4A may have a configuration in which the optical interference structure is removed.

An organic light-emitting device according to an embodiment will be described below. The organic light-emitting device according to the present embodiment includes at least a first electrode, a second electrode, and an organic compound layer disposed between these electrodes.

One of the first electrode and the second electrode is an anode, and the other is a cathode. In the organic light-emitting device according to the present embodiment, the organic compound layer may be formed of a single layer or a laminate including multiple layers, as long as it includes a light-emitting layer. When the organic compound layer is formed of a laminate including multiple layers, the organic compound layer may include, in addition to the light-emitting layer, a hole injection layer, a hole transport layer, an electron-blocking layer, a hole-exciton-blocking layer, an electron transport layer, and an electron injection layer, for example. The light-emitting layer may be formed of a single layer or a laminate including multiple layers. In the case of providing multiple light-emitting layers, a charge generation layer may be disposed between the light-emitting layers. The charge generation layer may be composed of a compound having a LUMO energy level lower than the hole transport layer, and the LUMO energy level of the charge generation layer may be lower than the HOMO energy level of the hole transport layer.

The LUMO energy level of the charge generation layer may be lower than the HOMO energy level of the first or second light-emitting layer. Here, the molecular orbital energy level of the organic compound layer may be the molecular orbital energy level of the organic compound having the highest proportion by weight in the organic compound layer.

Here, the HOMO level and the LUMO level are described as "higher" as they are closer to the vacuum level. The LUMO level of the charge generation layer being lower than the HOMO level of the hole transport layer indicates that the LUMO level of the charge generation layer is farther from the vacuum level than the HOMO level of the hole transport layer.

In this specification, HOMO and LUMO can be calculated by molecular orbital calculation. As the molecular orbital calculation method, the density functional theory (DFT) may be used with the B3LYP functional and 6-31G* as the basis function, for example. The molecular orbital calculation method was performed using a suitable method such as Gaussian 09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R.

Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford CT, 2010).

HOMO and LUMO levels in this specification can be calculated using an ionization potential and a band gap. The HOMO level can be estimated by measuring an ionization potential. The ionization potential can be measured by dissolving a target compound in a solvent, such as toluene, or depositing a target compound using vapor deposition on a substrate, such as a glass substrate, to form a film, and performing measurement with a measurement apparatus, such as AC-3. The band gap can be measured by dissolving a target compound in a solvent, such as toluene, and performing irradiation with excitation light. The band gap can be measured by measuring the absorption edge of the absorption spectrum of the compound irradiated with the excitation light. Alternatively, the measurement can be performed by depositing a target compound using vapor deposition on a substrate, such as a glass substrate, and irradiating the resulting film with excitation light. The band gap can be measured by measuring the absorption edge of the absorption spectrum of the film when the film absorbs the excitation light.

The LUMO level can be calculated using the values of the band gap and the ionization potential. The LUMO level can be estimated by subtracting the value of the ionization potential from the value of the band gap.

The LUMO level can also be estimated from a reduction potential. For example, a one-electron reduction potential is estimated by cyclic voltammetry (CV) measurement. The CV measurement can be performed, for example, in a 0.1 M solution of tetrabutylammonium perchlorate in DMF using Ag/Ag+ as a reference electrode, Pt as a counter electrode, and glassy carbon as a working electrode. The LUMO level can be estimated by adding −4.8 eV to the difference between the reduction potential of the obtained compound and the reduction potential of ferrocene.

In the organic light-emitting device according to the present embodiment, at least one layer of the organic compound layers contains an organometallic complex according to the present embodiment. Specifically, the organic compound according to the present embodiment is contained in any one of the light-emitting layer, the hole injection layer, the hole transport layer, the electron-blocking layer, the hole-exciton-blocking layer, the electron transport layer, the electron injection layer, and so forth. The organic compound according to the present embodiment can be contained in the light-emitting layer.

In the organic light-emitting device according to the present embodiment, when the organic compound according to the present embodiment is contained in a light-emitting layer, the light-emitting layer may be composed only of the organic compound according to the present embodiment or may be composed of an organometallic complex according to the present embodiment and another compound. When the light-emitting layer is composed of the organometallic complex according to the present embodiment and another compound, the organic compound according to the present embodiment may be used as a host or a guest of the light-emitting layer. The organic compound according to the present embodiment may be used as an assist material that can be contained in the light-emitting layer. The term "host" used here refers to a compound having the highest proportion by mass in compounds contained in the light-emitting layer. The term "guest" refers to a compound that has a lower proportion by mass than the host in the compounds contained in the light-emitting layer and that is responsible for main light emission. The term "assist material" refers to a compound that has a lower proportion by mass than the host in the compounds contained in the light-emitting layer and that assists the light emission of the guest. The assist material is also referred to as a "second host". The host material may be referred to as the "first compound". The assist material may be referred to as a "second compound".

When the organic compound according to the present embodiment is used as a guest in the light-emitting layer, the concentration of the guest is preferably 0.01% or more by mass and 20% or less by mass, more preferably 0.1% or more by mass and 10% or less by mass, based on the entire light-emitting layer.

The organic compound according to the present embodiment is used as a host or guest of a light-emitting layer, especially as a guest of a light-emitting layer, a device that emits light with high efficiency and high luminance and that is extremely durable can be provided. This light-emitting layer can be formed of a single layer or multiple layers and can also contain a light-emitting material having another emission color in order to conduct the color mixture of the red emission color of the present embodiment and another emission color. The term "multiple layers" refers to a state in which a light-emitting layer and another light-emitting layer are stacked. In this case, the emission color of the organic light-emitting device is not limited to red. More specifically, the emission color may be white or an intermediate color. In the case of white, another light-emitting layer emits light of a color other than red, that is, blue or green. A film-forming method is vapor deposition or coating. Details will be described in examples below.

The organometallic complex according to the present embodiment can be used as a component material of an organic compound layer other than the light-emitting layer included in the organic light-emitting device according to the embodiment. Specifically, the organometallic complex may be used as a component material of the electron transport layer, the electron injection layer, the hole transport layer, the hole injection layer, the hole-blocking layer, and so forth. In this case, the emission color of the organic light-emitting device is not limited to red. More specifically, the emission color may be white or intermediate color.

For example, a hole injection compound, a hole transport compound, a compound to be used as a host, a light-emitting compound, an electron injection compound, or an electron transport compound, which is known and has a low or high molecular weight, can be used together with the organic compound according to the present embodiment, as needed. Examples of these compounds are illustrated below.

As a hole injection-transport material, a material having a high hole mobility can be used so as to facilitate the injection of holes from the anode and to transport the injected holes to the light-emitting layer. To reduce a deterioration in film quality, such as crystallization, in the organic light-emitting device, a material having a high glass transition temperature can be used. Examples of a low- or high-molecular-weight material having the ability to inject and transport holes include triarylamine derivatives, aryl carbazole derivatives, phenylenediamine derivatives, stilbene derivatives, phthalocyanine derivatives, porphyrin derivatives, poly(vinyl carbazole), polythiophene, and other conductive polymers. Moreover, the hole injection-transport material can also be used for the electron-blocking layer. Non-limiting specific examples of a compound used as the hole injection-transport material will be illustrated below.

HT1
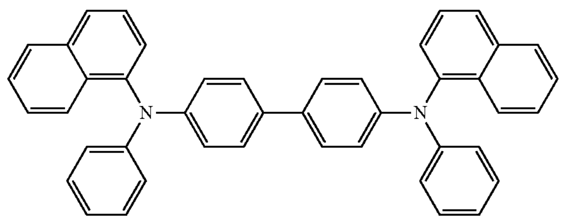
HT2
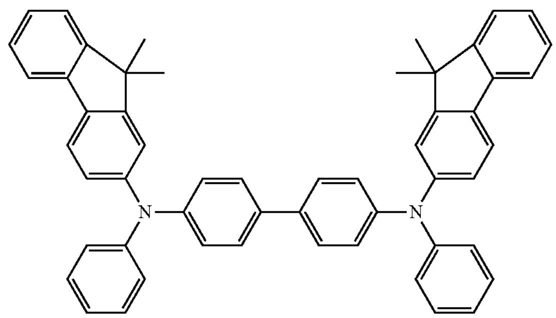
HT3
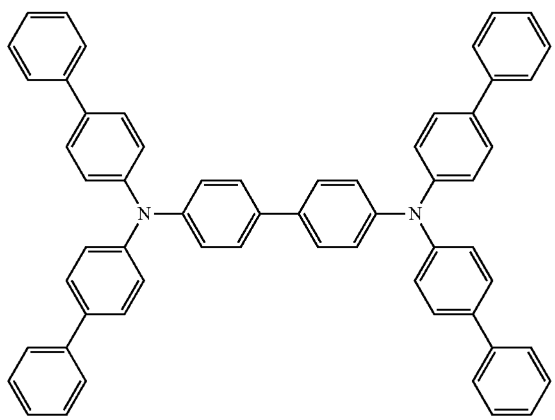
HT4
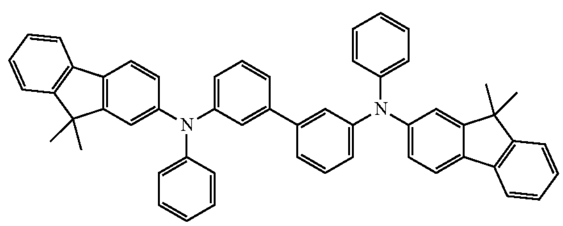
HT5
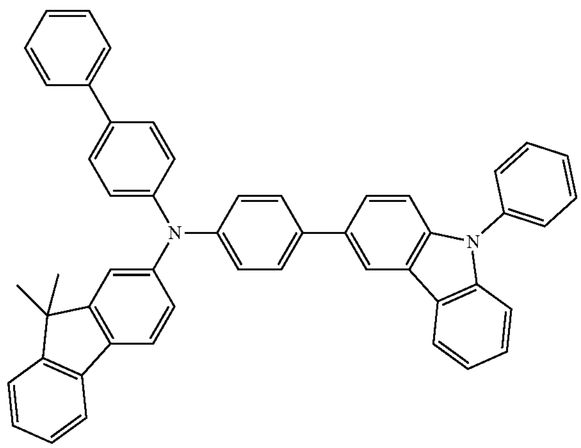
HT6
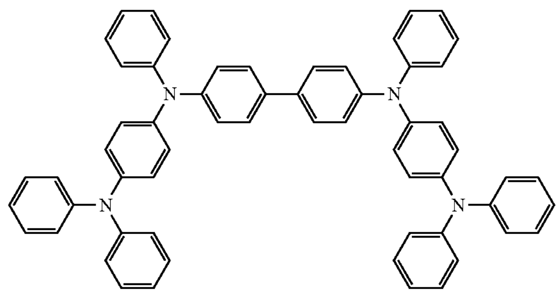

-continued
HT7
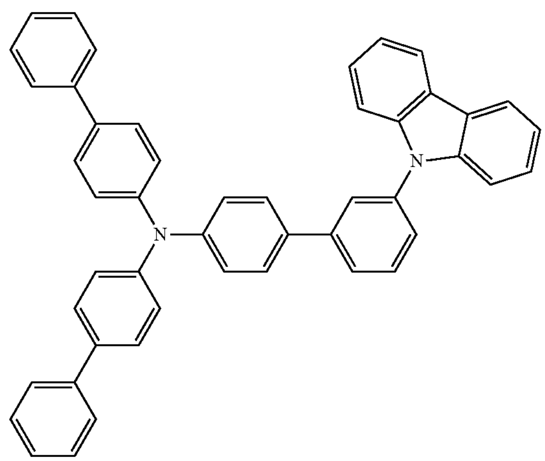
HT8
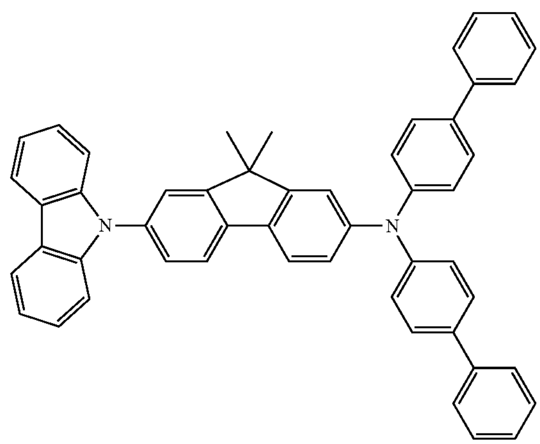
HT9
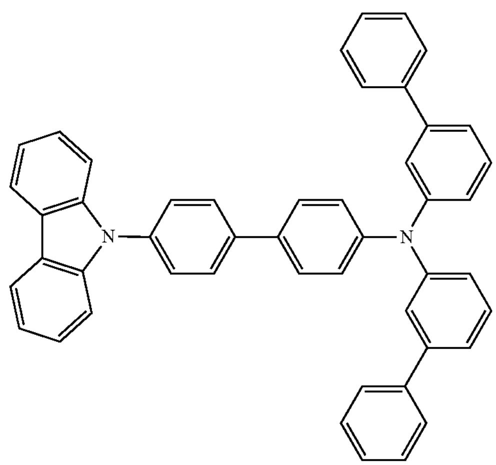
HT10
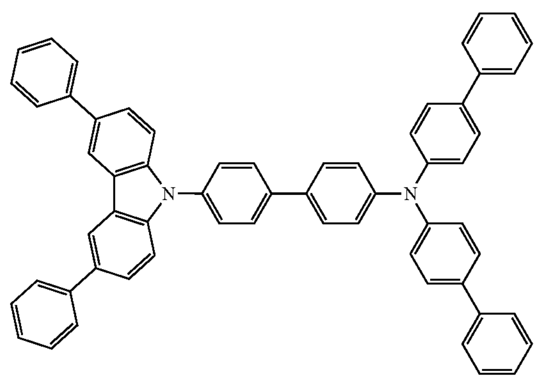
HT11
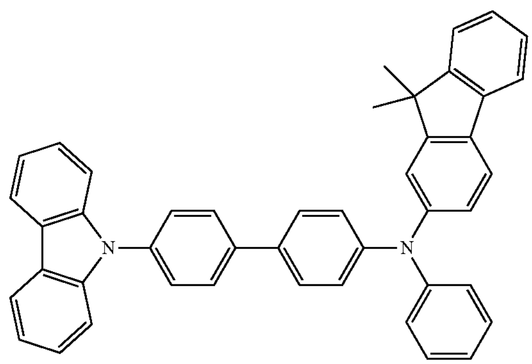
HT12
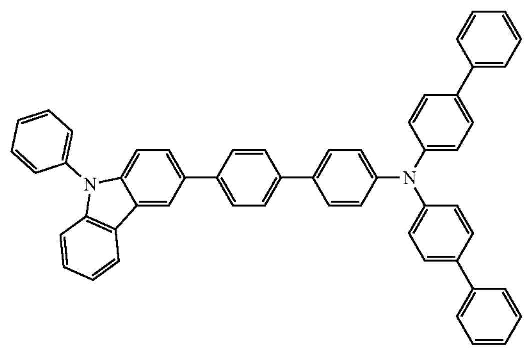
HT13
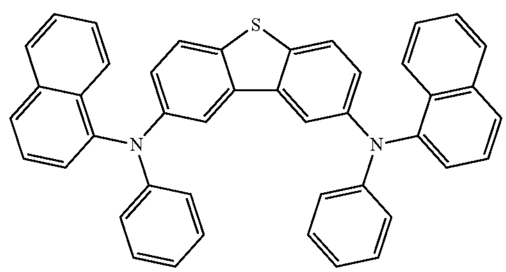
HT14
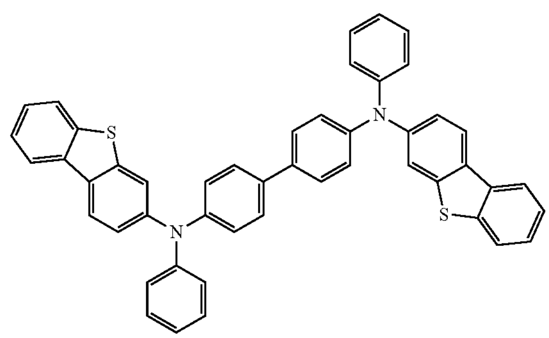

-continued
HT15
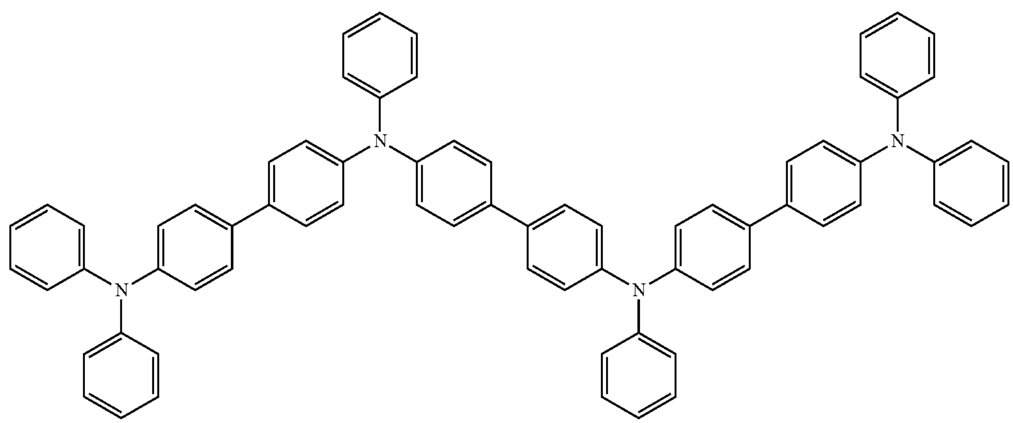
HT16
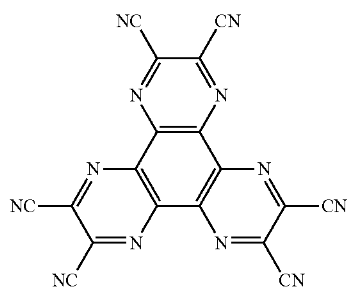
HT17
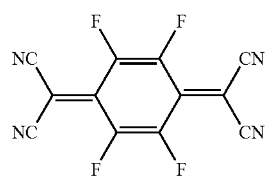
HT18
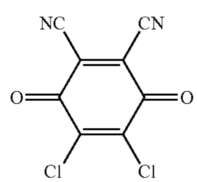
HT19
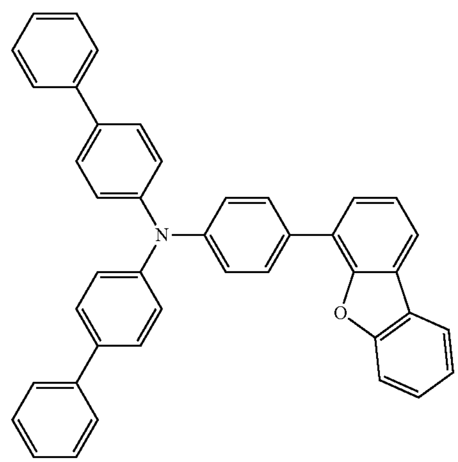
HT20
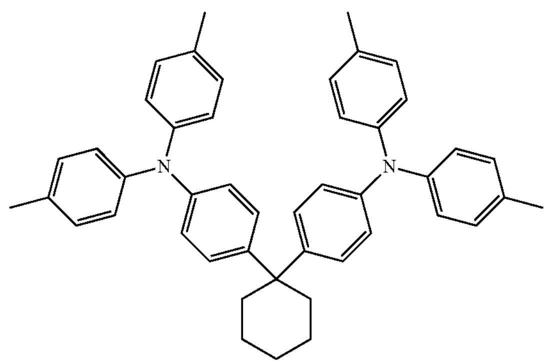
HT21
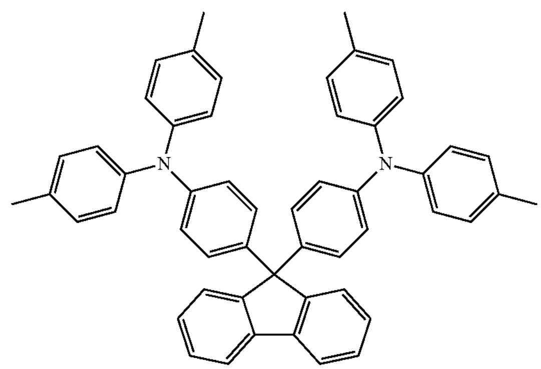

-continued
HT22
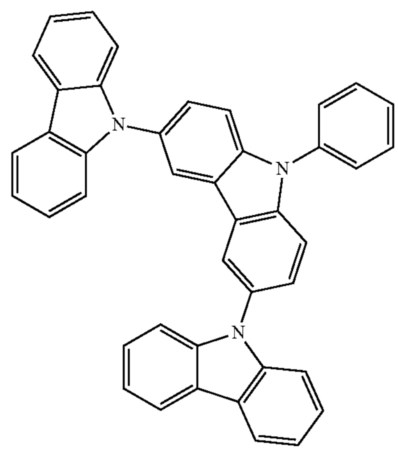
HT23
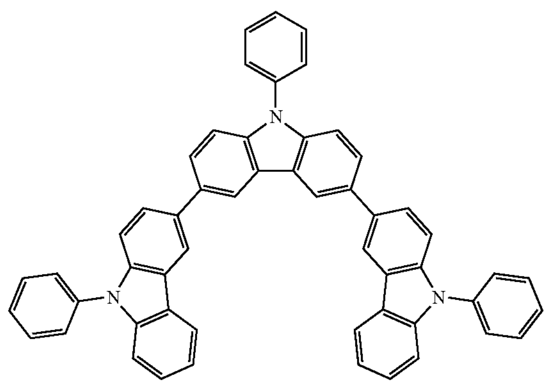
HT24
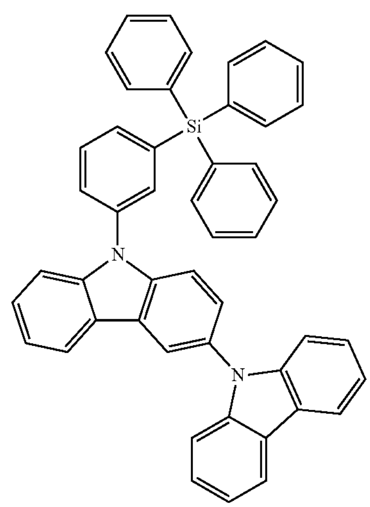
HT25
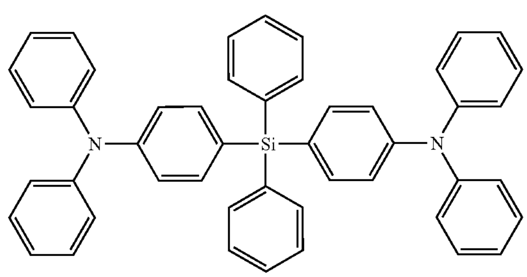
HT26
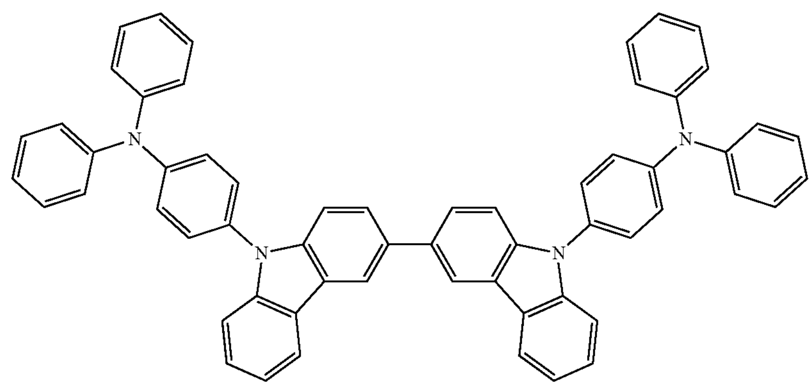

-continued

HT27

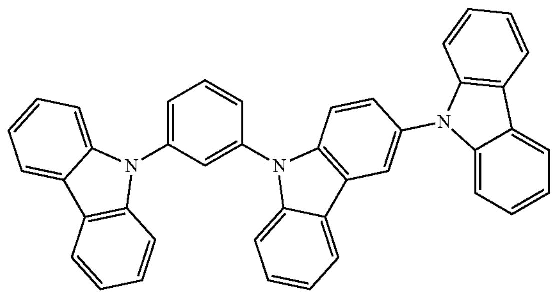

HT28

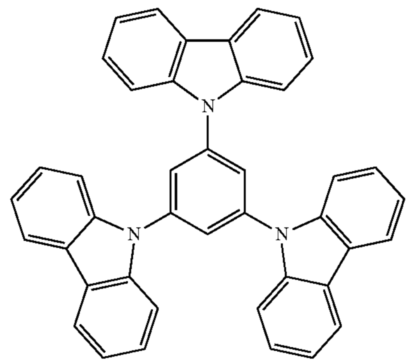

HT29

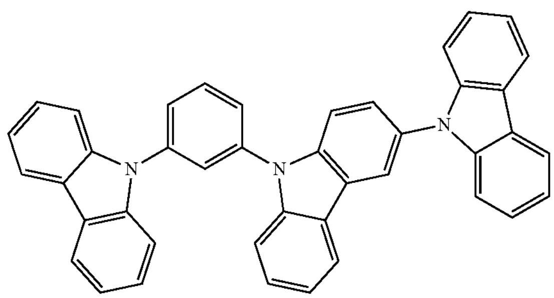

HT30

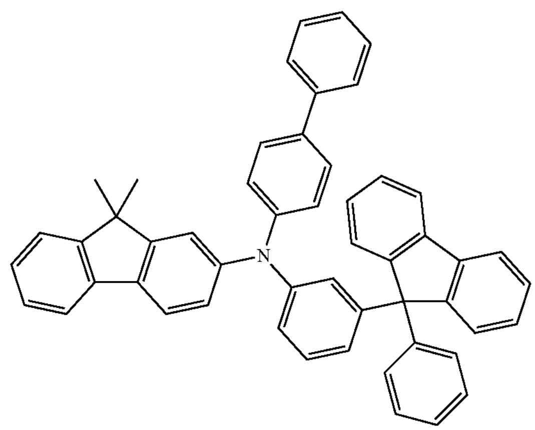

Among the hole transport materials illustrated above, HT16 to HT18 can be used in the layer in contact with the anode to reduce the driving voltage. HT16 to HT18 can be used for the charge generation layer. HT16 is widely used in organic light-emitting devices. HT2, HT3, HT4, HT5, HT6, HT10, and HT12 may be used in an organic compound layer adjacent to HT16. Multiple materials may be used in a single organic compound layer.

Examples of a light-emitting material mainly associated with a light-emitting function include fused-ring compounds, such as fluorene derivatives, naphthalene derivatives, pyrene derivatives, perylene derivatives, tetracene derivatives, anthracene compounds, and rubrene, quinacridone derivatives, coumarin derivatives, stilbene derivatives, organoaluminum complexes, such as tris(8-quinolinolato) aluminum, iridium complexes, platinum complexes, rhenium complexes, copper complexes, europium complexes, ruthenium complexes, and polymer derivatives, such as poly(phenylene vinylene) derivatives, polyfluorene derivatives, and polyphenylene derivatives.

Non-limiting specific examples of a compound used as a light-emitting material are described below.

BD1

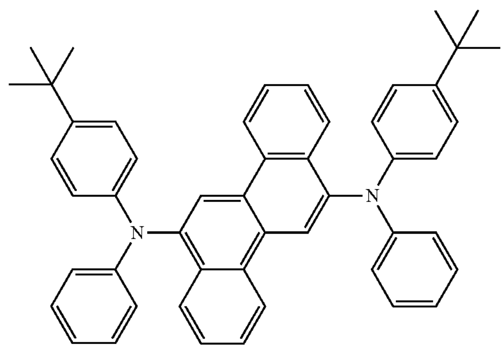

BD2

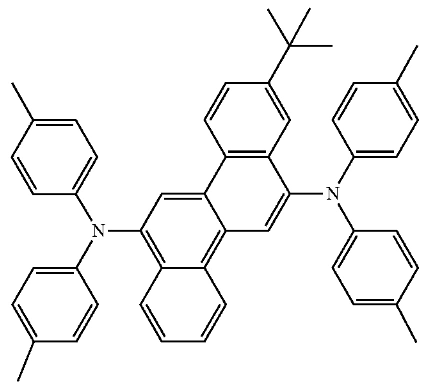

-continued
BD3
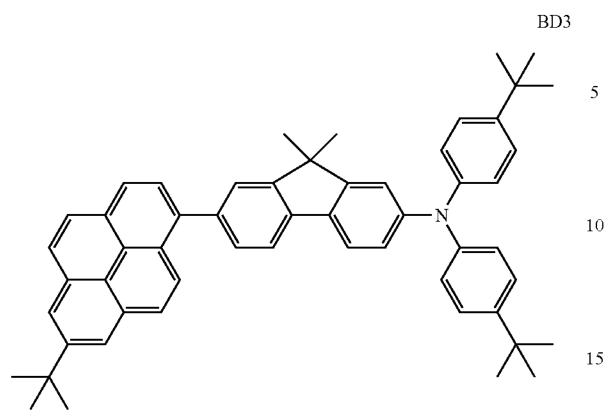
BD4
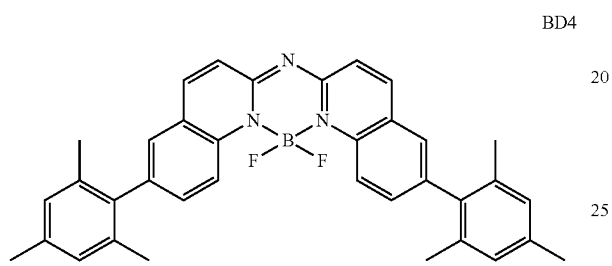
BD5
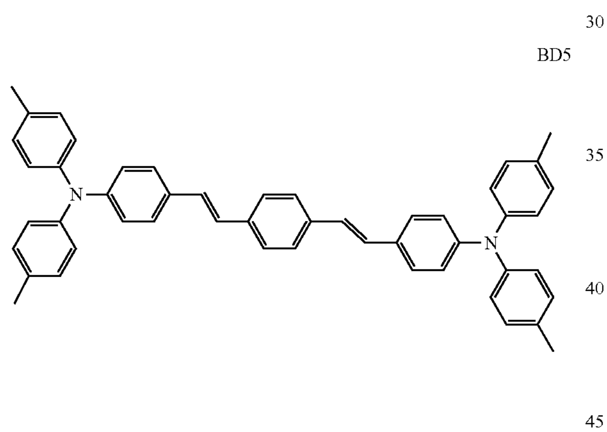
BD6
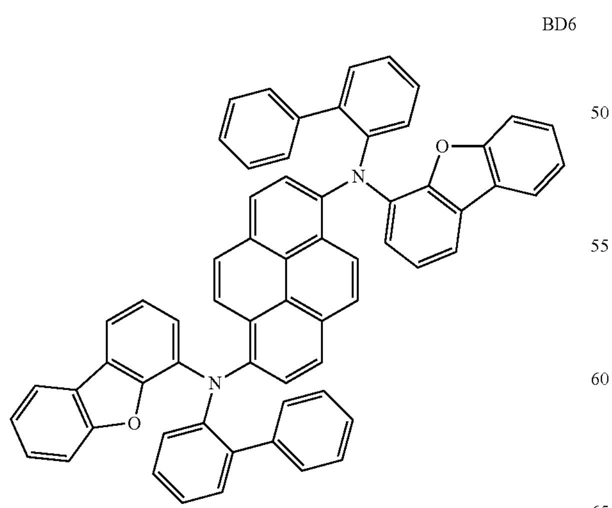
-continued
BD7
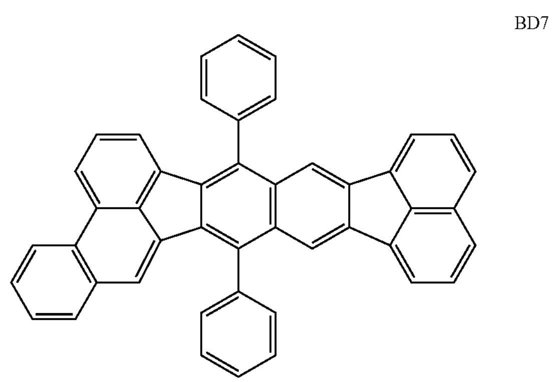
BD8
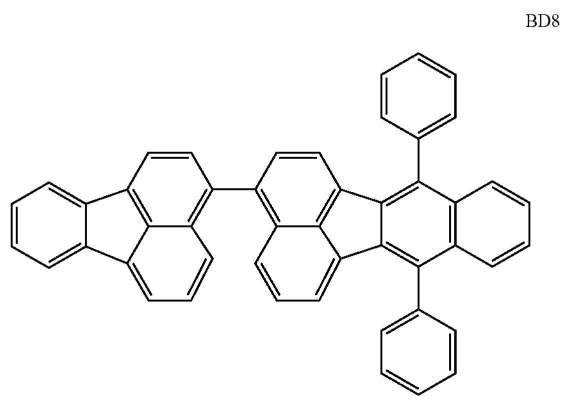
BD9
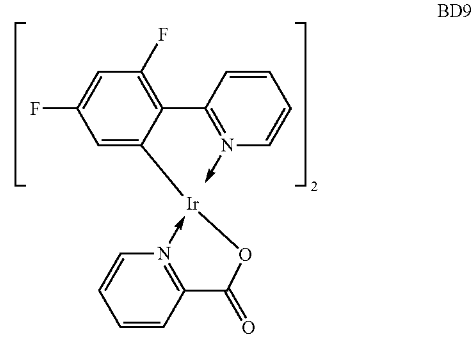
BD10
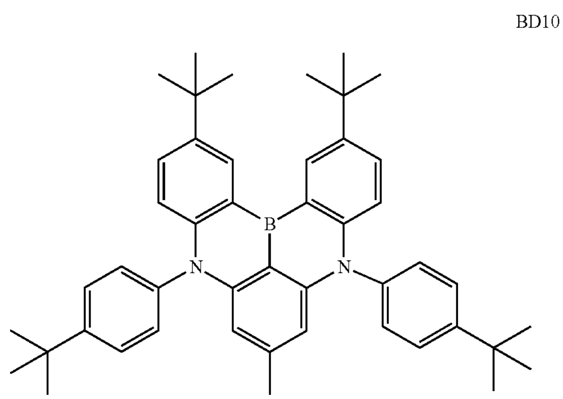

-continued
BD11
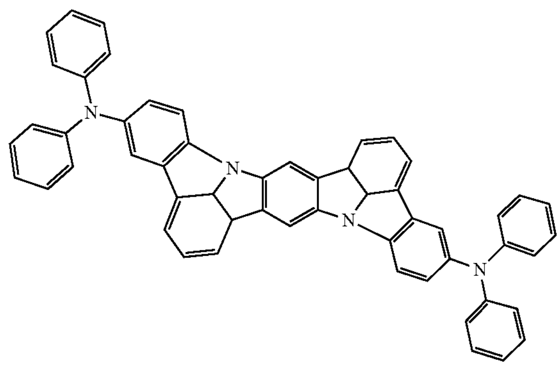
BD12
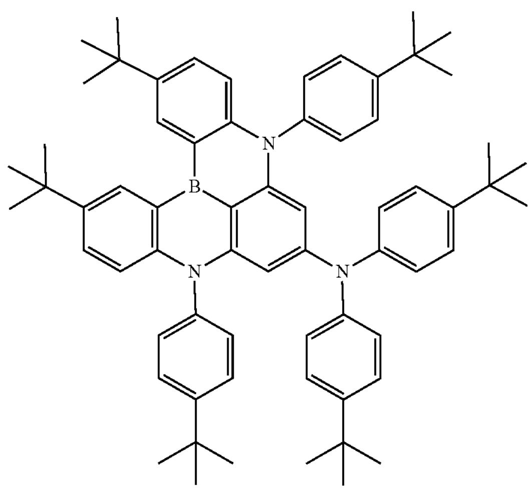
BD13
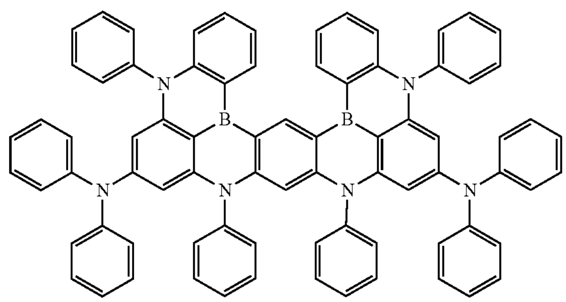
-continued
BD14
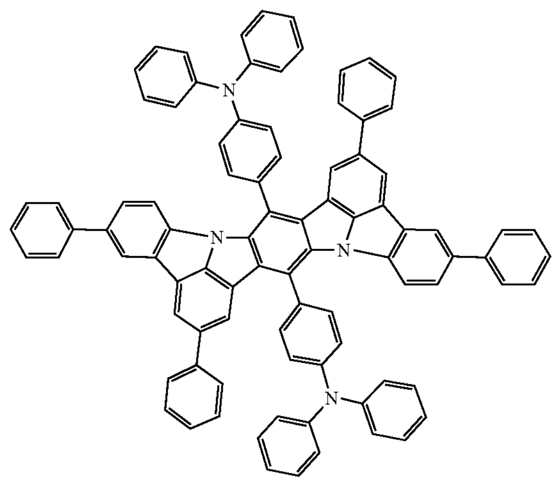
BD15
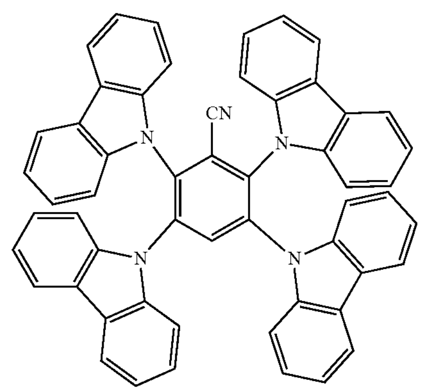
BD16
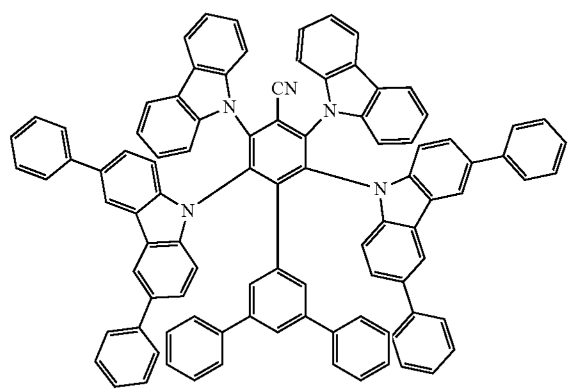
BD17
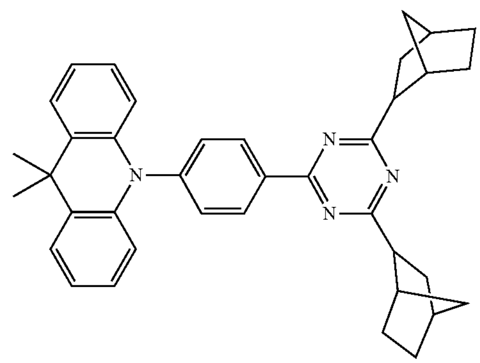

-continued
GD1
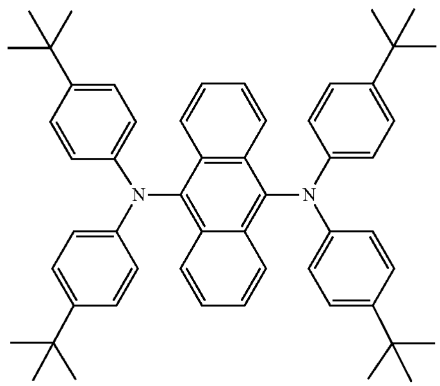
GD2
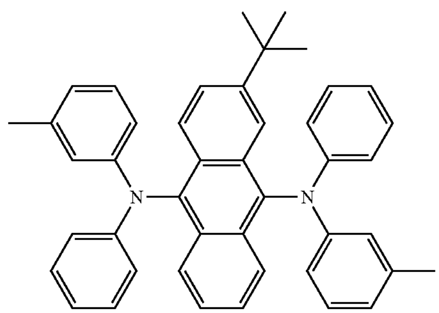
GD3
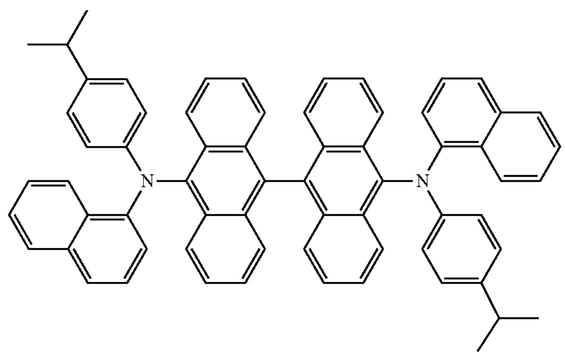
GD4
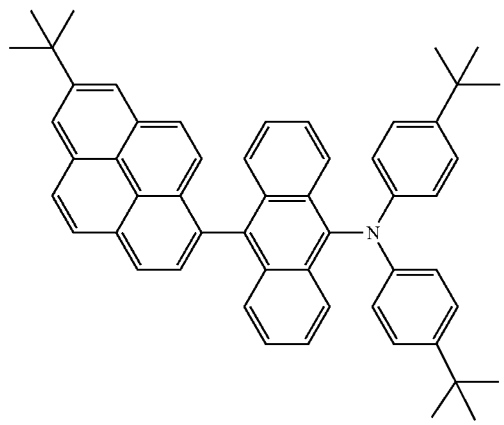
-continued
GD5
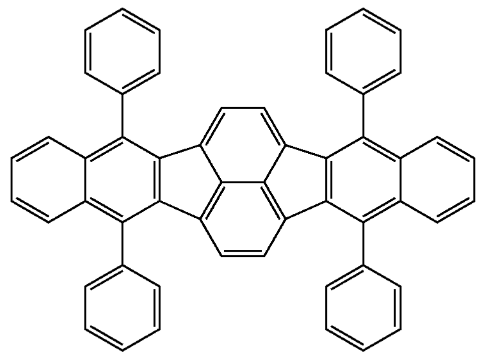
GD6
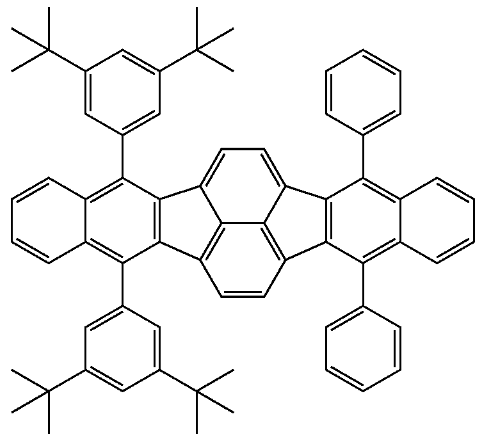
GD7
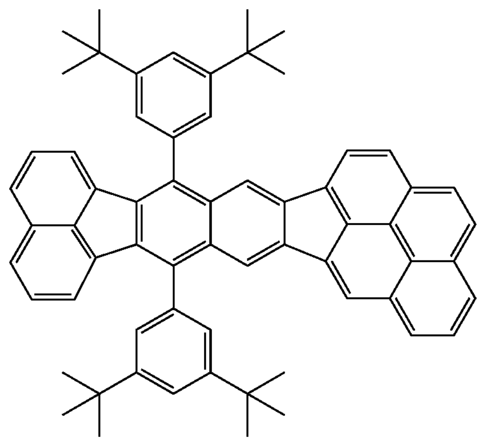
GD8
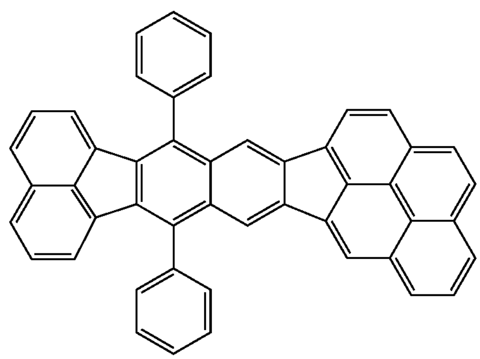

-continued
GD9
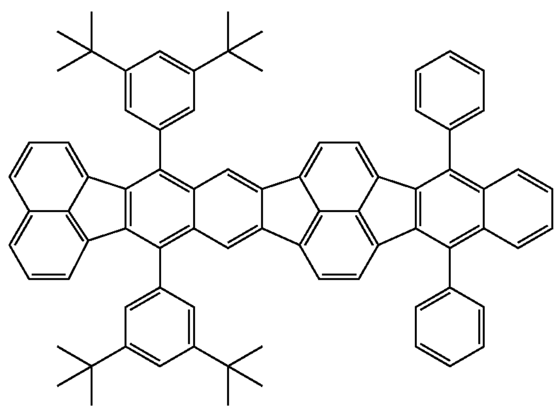
GD10
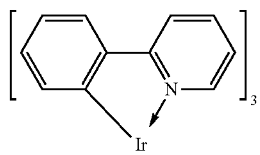
GD11
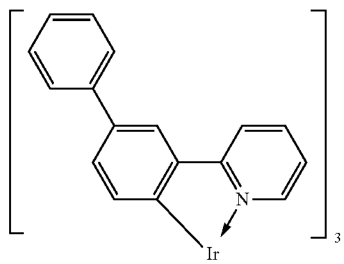
GD12
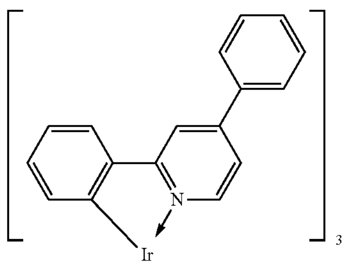
GD13
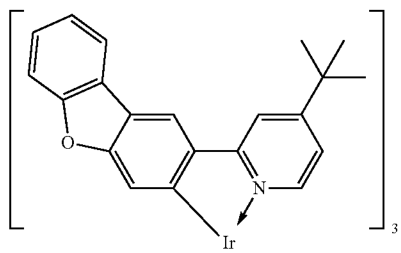
-continued
GD14
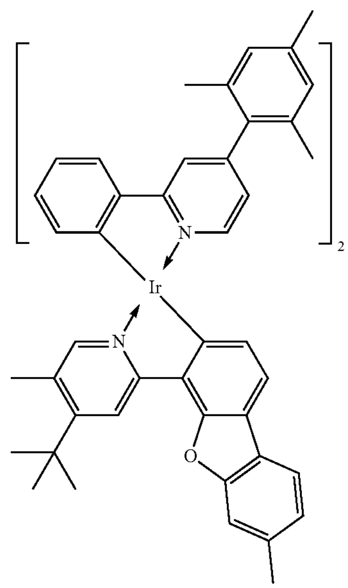
GD15
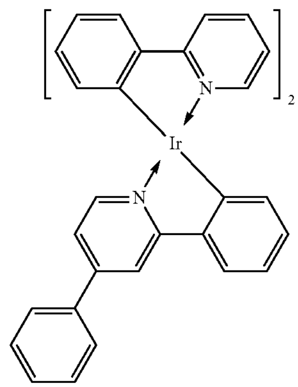
GD16
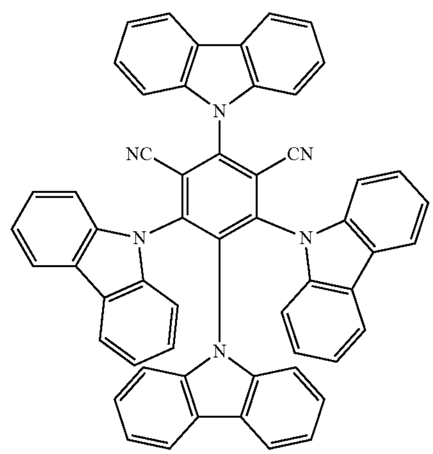
GD17
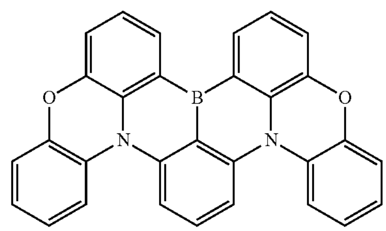

-continued
GD18
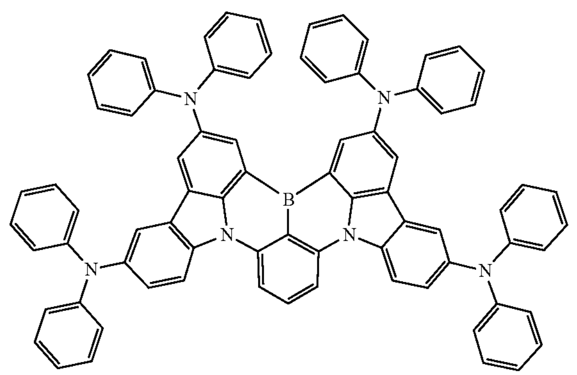
GD19
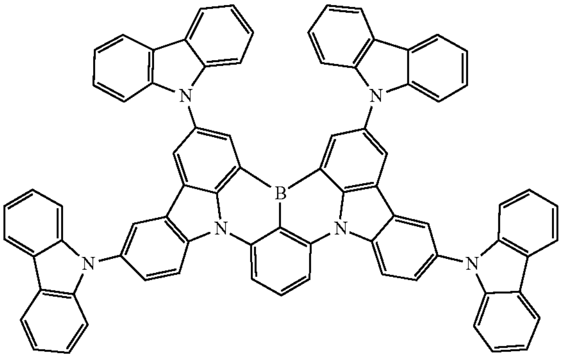
RD1
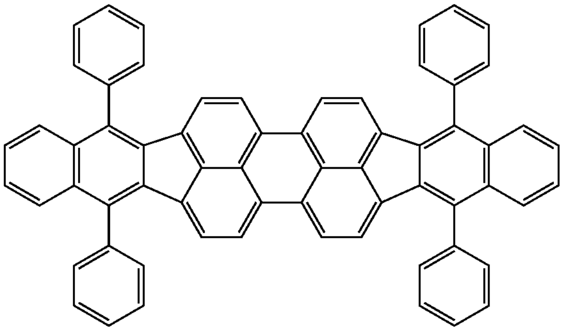
RD2
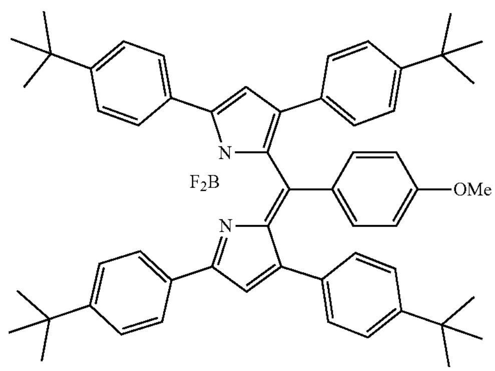
-continued
RD3
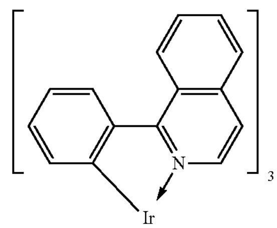
RD4
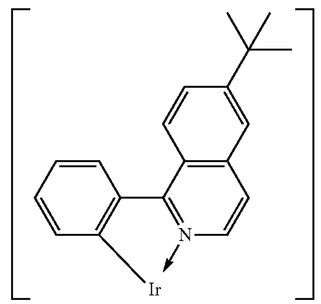
RD5
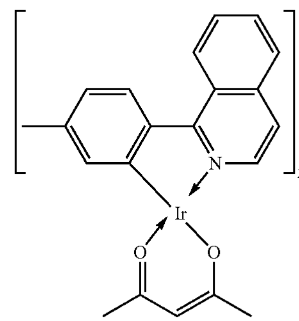
RD6
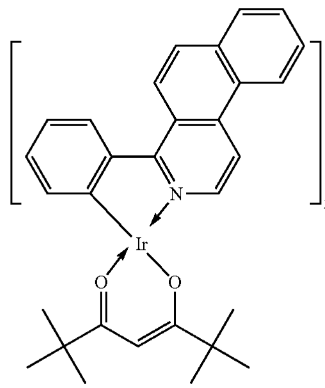
RD7
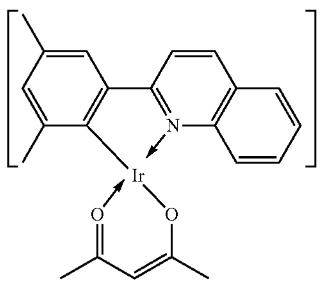

-continued

RD8

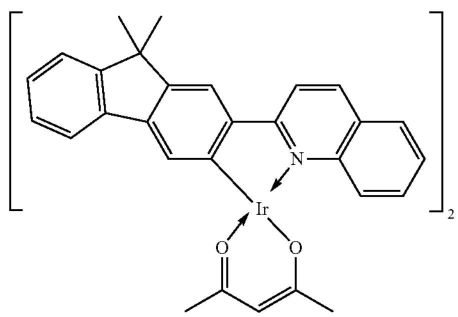

RD9

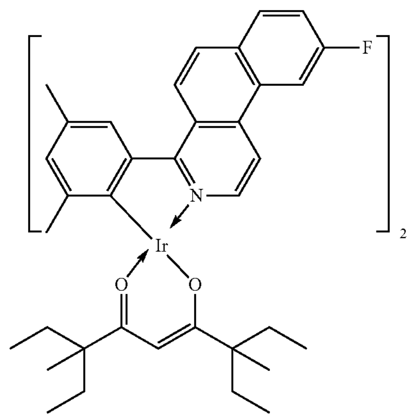

RD10

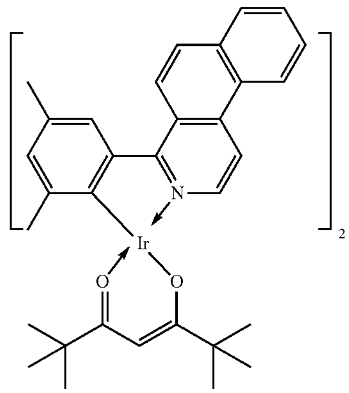

-continued

RD11

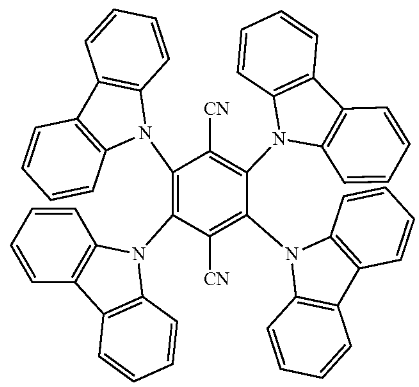

When the light-emitting material is a hydrocarbon compound, the material can reduce a decrease in luminous efficiency due to exciplex formation and a decrease in color purity due to a change in the emission spectrum of the light-emitting material caused by exciplex formation.

The hydrocarbon compound is a compound consisting only of carbon and hydrogen. Among the above exemplified compounds, BD7, BD8, GD5 to GD9, and RD1 are hydrocarbon compounds.

Each of BD10 to BD17 has a small difference in energy between the lowest excited singlet (S1) state and the lowest excited triplet (T1) state; thus, these materials can be excited from the T1 energy level to the S1 energy level. These are also referred to as thermally activated delayed fluorescence materials.

When the light-emitting material is a fused polycyclic compound containing a five-membered ring, the material has a high ionization potential and high resistance to oxidation. This can provide a highly durable device with a long lifetime. Among the above exemplified compounds, BD7, BD8, GD5 to GD9, and RD1 are five-membered-ring-containing fused polycyclic compounds.

Examples of a host or an assist material in the light-emitting layer include aromatic hydrocarbon compounds and derivatives thereof, carbazole derivatives, dibenzofuran derivatives, dibenzothiophene derivatives, organoaluminum complexes, such as tris(8-quinolinolato)aluminum, and organoberyllium complexes.

Non-limiting specific examples of a compound used as a light-emitting-layer host or an assist material contained in the light-emitting layer will be illustrated below.

EM1

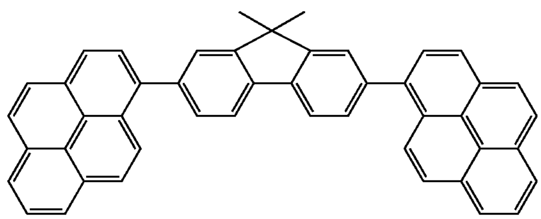

EM2

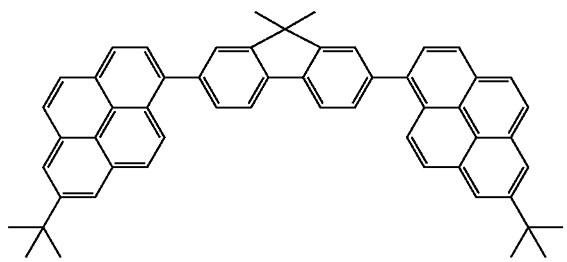

-continued
EM3
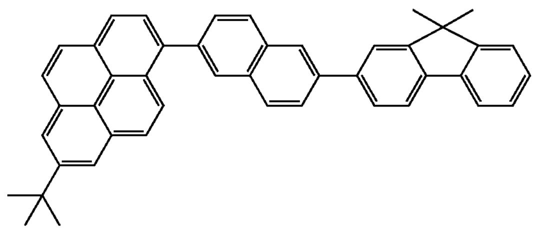
EM4
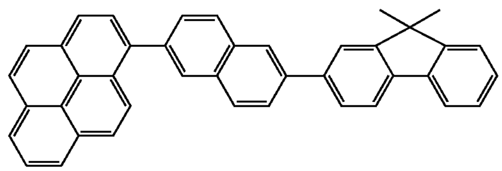
EM5
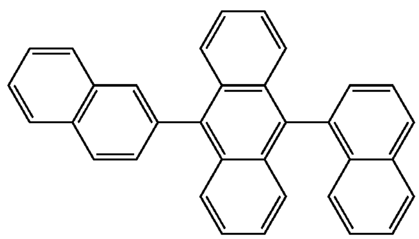
EM6
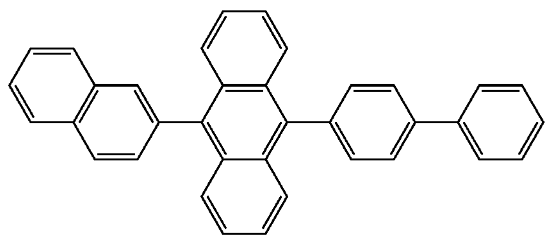
EM7
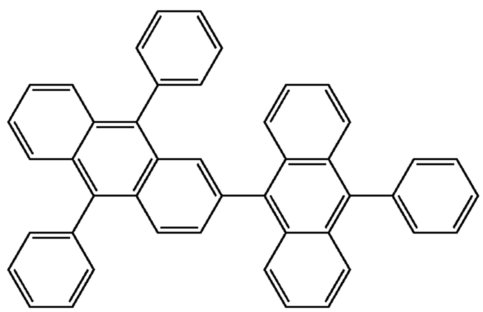
EM8
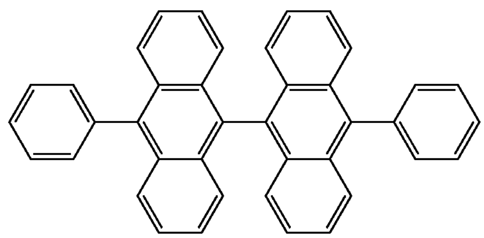
EM9
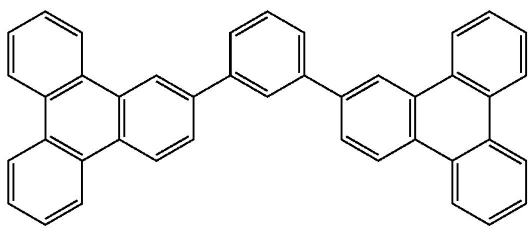
EM10
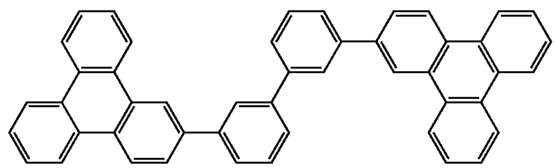
EM11
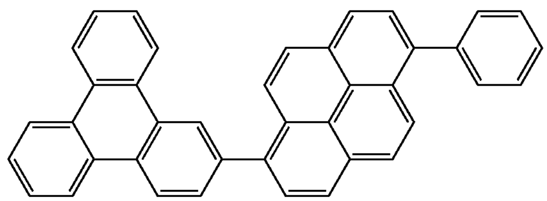
EM12
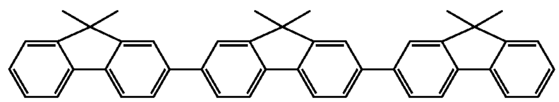
EM13
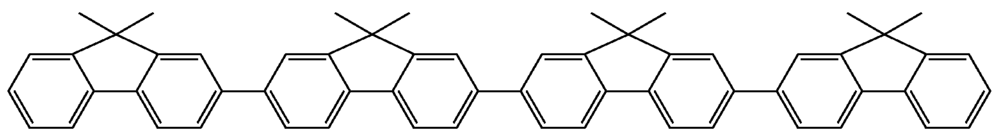
EM14
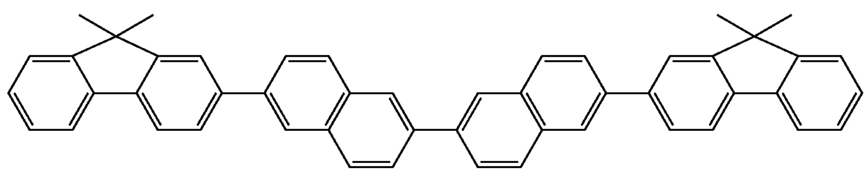

-continued
EM15
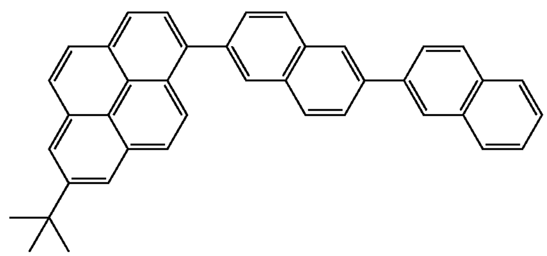
EM16
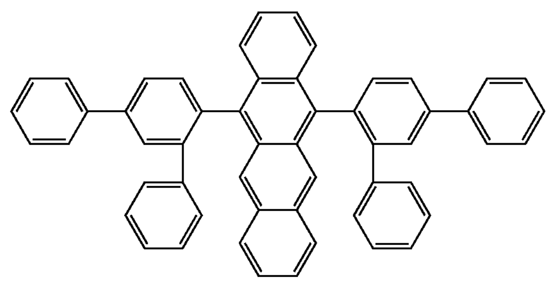
EM17
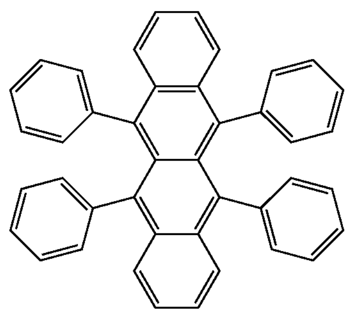
EM18
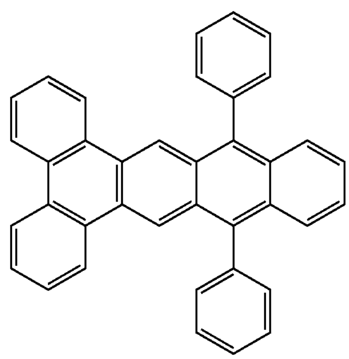
EM19
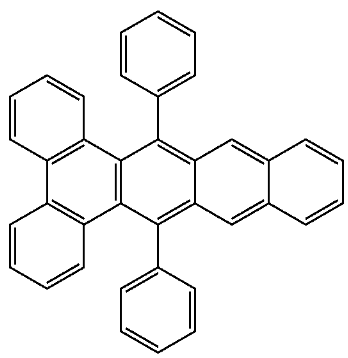
EM20
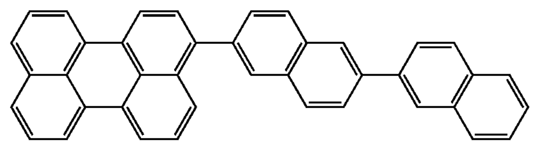
EM21
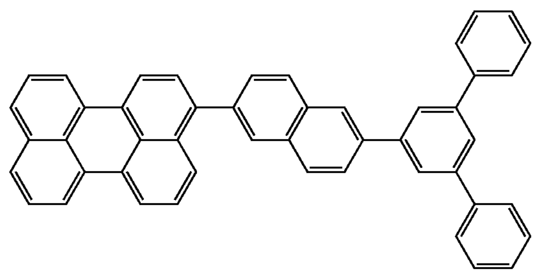
EM22
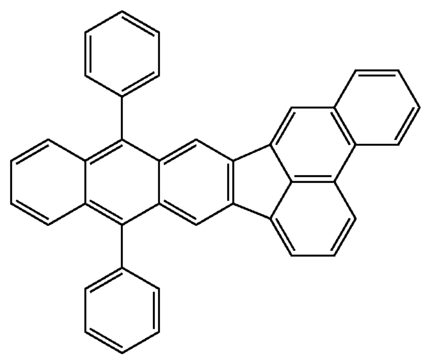

-continued
EM23
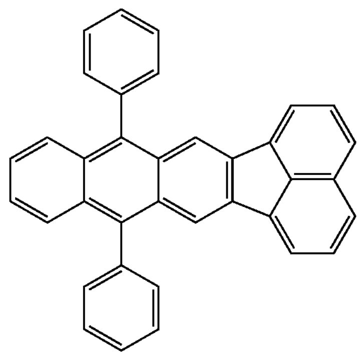
EM24
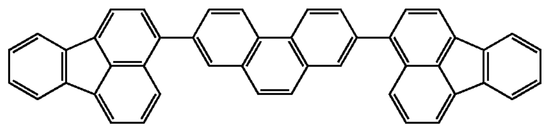
EM25
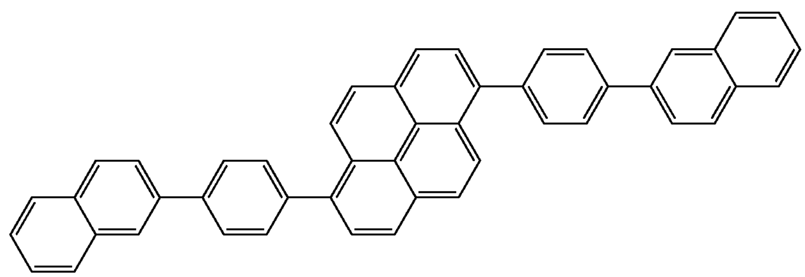
EM26
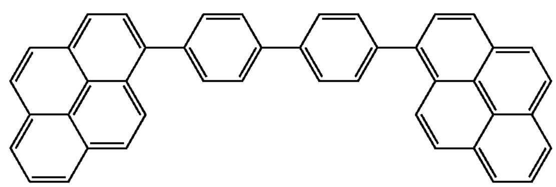
EM27
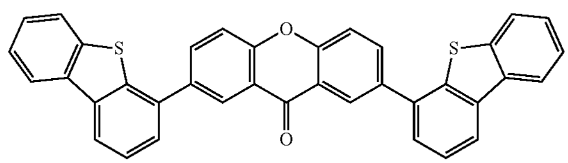
EM28
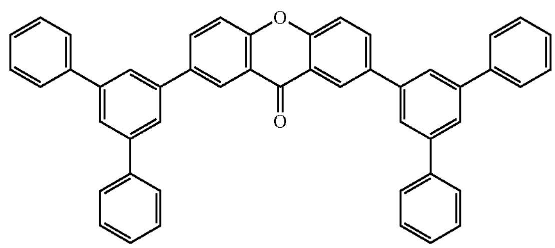
EM29
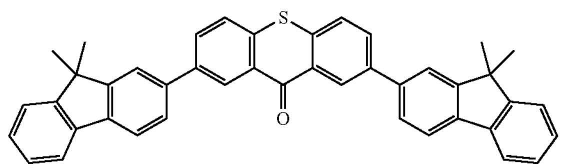
EM30
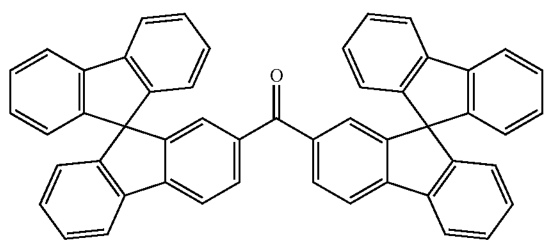
EM31
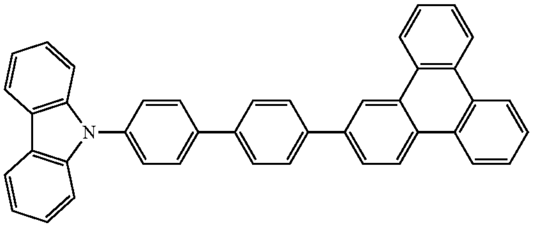
EM32
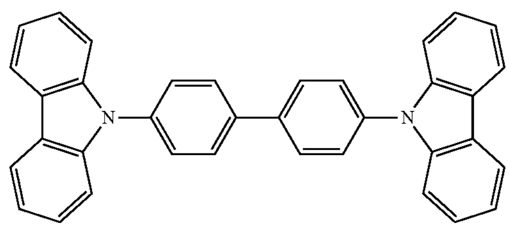

When the host material is a hydrocarbon compound, the compound according to an embodiment can easily trap electrons and holes to greatly contribute to higher efficiency. The hydrocarbon compound is a compound consisting only of carbon and hydrogen. Among the above exemplified compounds, EM1 to EM12 and EM16 to EM27 are hydrocarbon compounds.

The electron transport material can be freely-selected from materials capable of transporting electrons injected from the cathode to the light-emitting layer and is selected in consideration of, for example, the balance with the hole mobility of the hole transport material. Examples of a material having the ability to transport electrons include oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused-ring compounds, such as fluorene derivatives, naphthalene derivatives, chrysene derivatives, and anthracene derivatives. The electron transport materials can be used for the hole-blocking layer.

Non-limiting specific examples of a compound used as the electron transport material will be described below.

E1

ET2

ET3

ET4

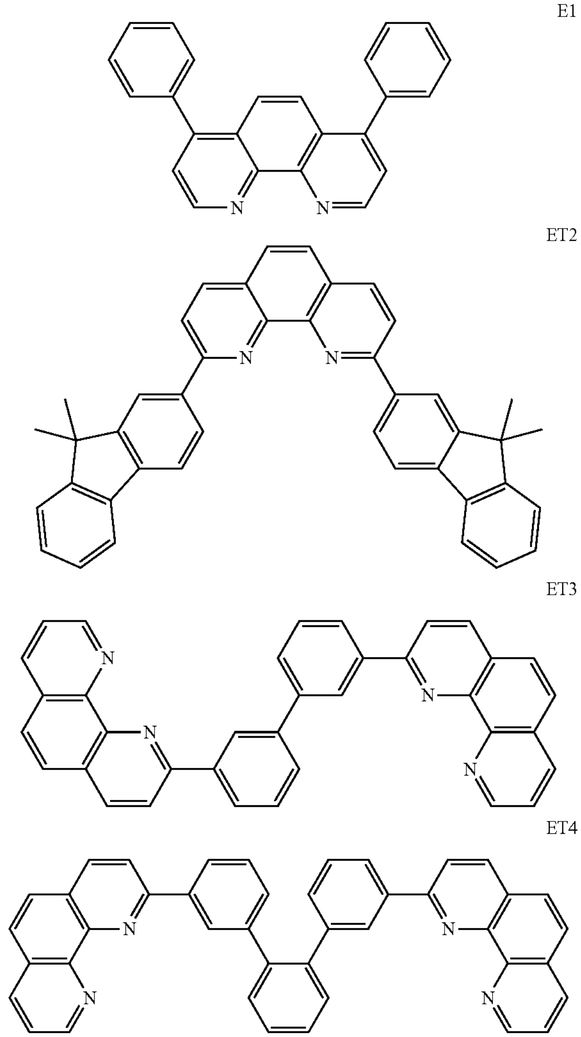

-continued

ET5

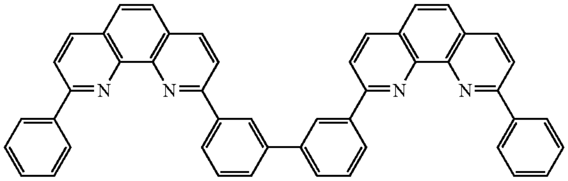

ET6

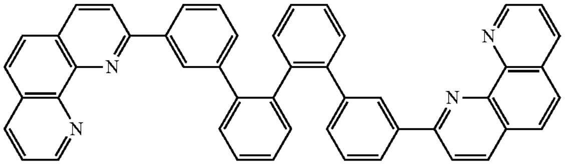

ET7

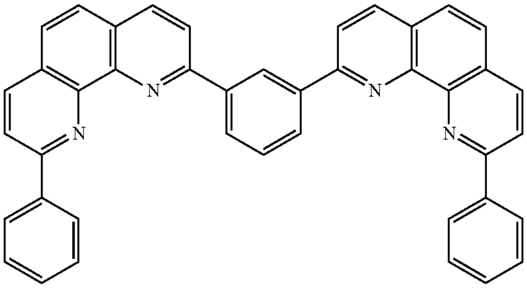

ET8

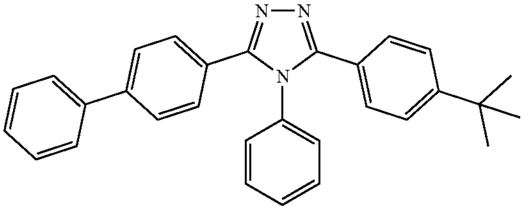

ET9

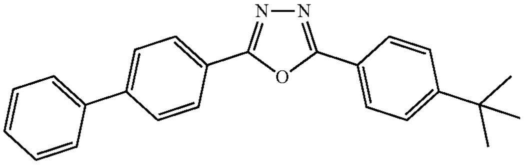

ET10

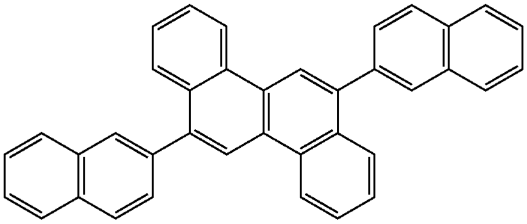

-continued
ET11
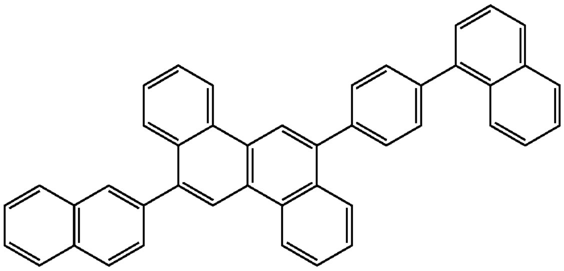
ET12
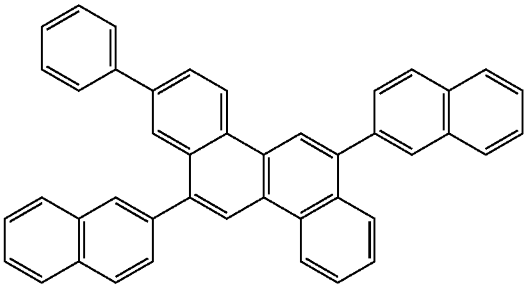
ET13
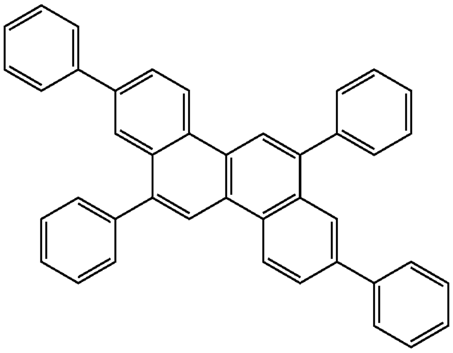
ET14
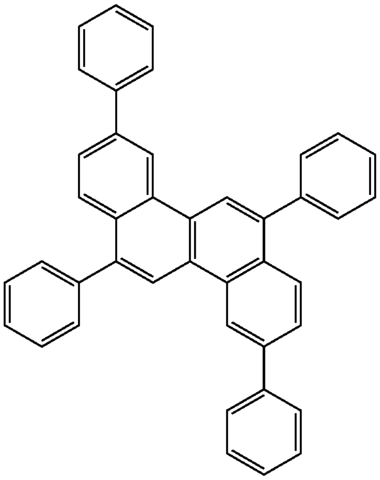
-continued
ET15
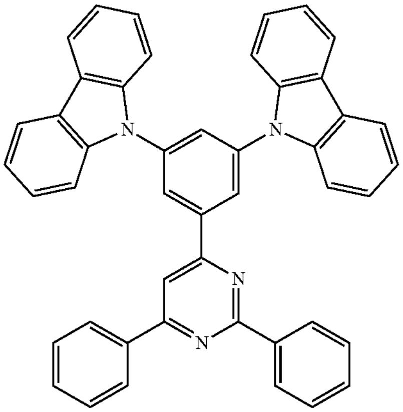
ET16
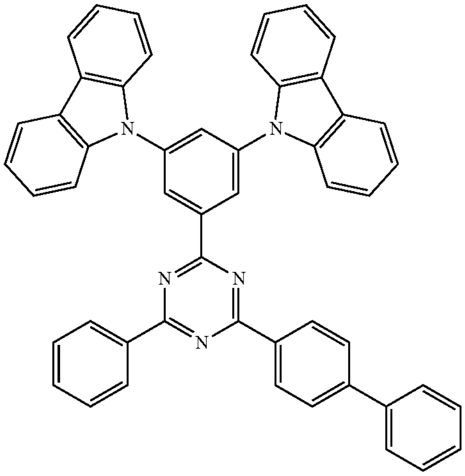
ET17
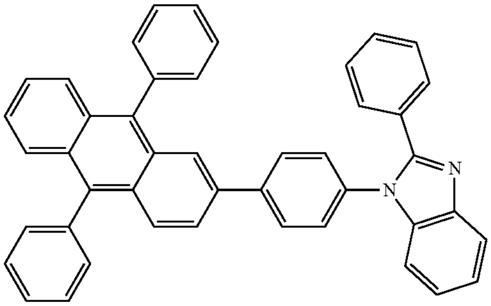
ET18
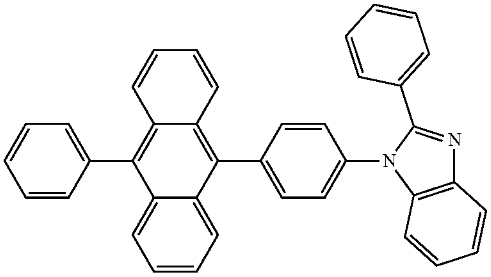

-continued

ET19

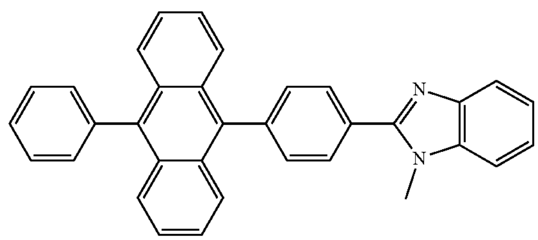

ET20

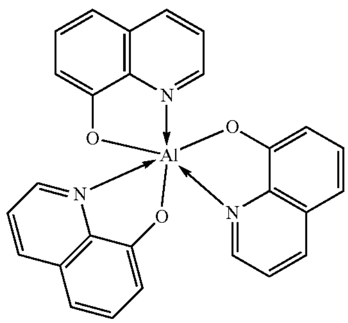

ET21

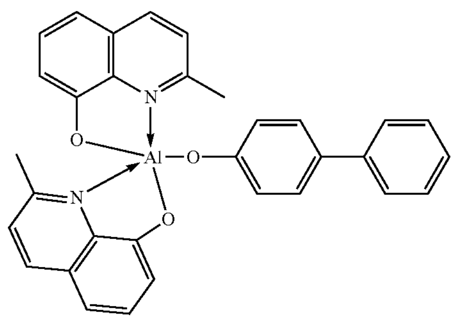

ET22

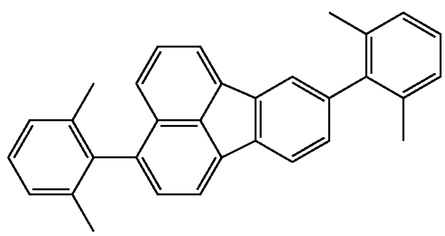

ET23

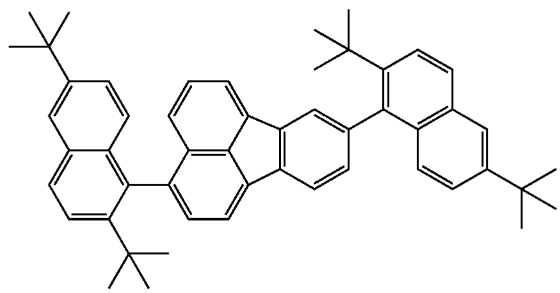

An electron injection material can be freely-selected from materials capable of easily injecting electrons from the cathode and is selected in consideration of, for example, the balance with the hole injection properties. As the organic compound, n-type dopants and reducing dopants are also included. Examples thereof include alkali metal-containing compounds such as lithium fluoride, lithium complexes such as lithium quinolinolate, benzimidazolidene derivatives, imidazolidene derivatives, fulvalene derivatives, and acridine derivatives.

It can also be used in combination with the above-mentioned electron transport material.

Configuration of Organic Light-Emitting Device

The organic light-emitting device includes an insulating layer, a first electrode, an organic compound layer, a second electrode over a substrate. A protective layer, a color filter, a microlens, and so forth may be disposed over the cathode.

In the case of disposing the color filter, a planarization layer may be disposed between the protective layer and the color filter. The planarization layer can be composed of, for example, an acrylic resin. The same applies when a planarization layer is provided between the color filter and the microlens.

Substrate

Examples of the substrate include silicon wafers, quartz substrates, glass substrates, resin substrates, and metal substrates. The substrate may include a switching element, such as a transistor, a line, and an insulating layer thereon. Any material can be used for the insulating layer as long as a contact hole can be formed in such a manner that a line can be coupled to the first electrode and as long as insulation with a non-connected line can be ensured. For example, a resin, such as polyimide, silicon oxide, or silicon nitride, can be used.

Electrode

A pair of electrodes can be used. The pair of electrodes may be an anode and a cathode.

In the case where an electric field is applied in the direction in which the organic light-emitting device emits light, an electrode having a higher potential is the anode, and the other is the cathode. It can also be said that the electrode that supplies holes to the light-emitting layer is the anode and that the electrode that supplies electrons is the cathode.

As the component material of the anode, a material having a work function as high as possible can be used. Examples of the material that can be used include elemental metals, such as gold, platinum, silver, copper, nickel, palladium, cobalt, selenium, vanadium, and tungsten, mixtures thereof, alloys of combinations thereof, and metal oxides, such as tin oxide, zinc oxide, indium oxide, indium-tin oxide (ITO), and indium-zinc oxide. Additionally, conductive polymers, such as polyaniline, polypyrrole, and polythiophene, can be used.

These electrode materials may be used alone or in combination of two or more. The anode may be formed of a single layer or multiple layers.

When the anode is used as a reflective electrode, for example, chromium, aluminum, silver, titanium, tungsten, molybdenum, an alloy thereof, or a stack thereof may be used. These materials can also be used to act as a reflective film that does not have the role of an electrode. When the anode is used as a transparent electrode, a transparent conductive oxide layer composed of, for example, indium-tin oxide (ITO) or indium-zinc oxide may be used; however, the anode is not limited thereto.

The electrode can be formed by photolithography.

As the component material of the cathode, a material having a lower work function can be used. Examples thereof include elemental metals such as alkali metals, e.g., lithium, alkaline-earth metals, e.g., calcium, aluminum, titanium, manganese, silver, lead, and chromium, and mixtures thereof. Alloys of combinations of these elemental metals can also be used. For example, magnesium-silver, aluminum-lithium, aluminum-magnesium, silver-copper, and zinc-silver can be used. Metal oxides, such as ITO, can also be used. These electrode materials may be used alone or in combination of two or more. The cathode may have a single-layer structure or a multilayer structure. In particular, silver can be used. To reduce the aggregation of silver, a silver alloy can be used. Any alloy ratio may be used as long as the aggregation of silver can be reduced. The ratio of silver to another metal may be, for example, 1:1 or 3:1.

A top emission device may be provided using the cathode formed of a conductive oxide layer composed of, for example, ITO. A bottom emission device may be provided using the cathode formed of a reflective electrode composed of, for example, aluminum (Al). Any type of cathode may be used. Any method for forming the cathode may be employed. For example, a direct-current or alternating-current sputtering technique can be employed because good film coverage is obtained and thus the resistance is easily reduced.

Pixel Separation Layer

The pixel separation layer is formed of a silicon nitride (SiN) film, a silicon oxynitride (SiON) film, or a silicon oxide (SiO) film formed by a chemical vapor deposition (CVD) method.

To increase the resistance in the in-plane direction of the organic compound layer, the organic compound layer, in particular, the hole transport layer, can be formed so as to have a small thickness at the side wall of the pixel separation layer. Specifically, the organic compound layer can be formed so as to have a small thickness at the side wall of the pixel separation layer by increasing the taper angle of the side wall of the pixel separation layer or the thickness of the pixel separation layer to increase vignetting at the time of vapor deposition.

The taper angle of the side wall of the pixel separation layer and the thickness of the pixel separation layer can be adjusted to such an extent that a void is not formed in the protective layer formed over the pixel separation layer. Voids are not formed in the protective layer; thus, the occurrence of defects in the protective layer can be reduced. Since the occurrence of defects in the protective layer is reduced, it is possible to reduce reliability deterioration, such as the formation of dark spots and the occurrence of poor conduction of the second electrode.

According to the embodiment, even if the taper angle of the side wall of the pixel separation layer is not steep, it is possible to effectively inhibit charge leakage to an adjacent pixel. As a result of this study, it has been found that a sufficient reduction can be achieved when the taper angle is 60° or more and 90° or less. The pixel separation layer can have a thickness of 10 nm or more and 150 nm or less. The same effect can be provided even if the pixel electrode does not include the pixel separation layer. However, in this case, the thickness of the pixel electrode can be less than or equal to the half of the thickness of the organic layer, or the pixel electrode can have a forward tapered end portion of less than 60°, because the short circuit of the organic light-emitting device can be reduced.

In the case where the first electrode is used as a cathode and where the second electrode is used as an anode, a wide color gamut and low-voltage driving can be achieved by using the electron transport material and forming the charge transport layer and a light-emitting layer on the charge transport layer.

Organic Compound Layer

The organic compound layer may be formed of a single layer or multiple layers. When multiple layers are present, they may be referred to as a hole injection layer, a hole transport layer, an electron-blocking layer, a light-emitting layer, a hole-blocking layer, an electron transport layer, or an electron injection layer in accordance with their functions. The organic compound layer is mainly composed of an organic compound, and may contain inorganic atoms and an inorganic compound. For example, the organic compound layer may contain, for example, copper, lithium, magnesium, aluminum, iridium, platinum, molybdenum, or zinc. The organic compound layer may be disposed between the first electrode and the second electrode, and may be disposed in contact with the first electrode and the second electrode.

Protective Layer

A protective layer may be disposed on the second electrode. For example, a glass member provided with a moisture absorbent can be bonded to the second electrode to reduce the entry of, for example, water into the organic compound layer, thereby reducing the occurrence of display defects. In another embodiment, a passivation film composed of, for example, silicon nitride may be disposed on the cathode to reduce the entry of, for example, water into the organic compound layer. For example, after the formation of the cathode, the substrate may be transported to another chamber without breaking the vacuum, and a silicon nitride film having a thickness of 2 μm may be formed by a CVD method to provide a protective layer. After the film deposition by the CVD method, a protective layer may be formed by an atomic layer deposition (ALD) method. Non-limiting examples of the material of the layer formed by the ALD method may include silicon nitride, silicon oxide, and aluminum oxide. Silicon nitride may be deposited by the CVD method on the layer formed by the ALD method. The film formed by the ALD method may have a smaller film thickness than the film formed by the CVD method. Specifically, the thickness may be 50% or less, even 10% or less.

Color Filter

A color filter may be disposed on the protective layer. For example, a color filter may be disposed on another substrate in consideration of the size of the organic light-emitting device and bonded to the substrate provided with the organic light-emitting device. A color filter may be formed by patterning on the protective layer using photolithography. The color filter may be composed of a polymer.

Planarization Layer

A planarization layer may be disposed between the color filter and the protective layer. The planarization layer is provided for the purpose of reducing the unevenness of the layer underneath. The planarization layer may be referred to as a "material resin layer" without limiting its purpose. The planarization layer may be composed of an organic compound. A low- or high-molecular-weight organic compound may be used. A high-molecular-weight organic compound can be used.

The planarization layers may be disposed above and below (or on) the color filter and may be composed of the same or different component materials. Specific examples thereof include poly(vinyl carbazole) resins, polycarbonate resins, polyester resins, acrylonitrile butadiene styrene (ABS) resins, acrylic resins, polyimide resins, phenolic resins, epoxy resins, silicone resins, and urea resins.

Microlens

The organic light-emitting apparatus may include an optical member, such as a microlens, on the outgoing light side. The microlens can be composed of, for example, an acrylic resin or an epoxy resin. The microlens may be used to increase the amount of light emitted from the organic light-emitting apparatus and to control the direction of the light emitted. The microlens may have a hemispherical shape. In the case of a hemispherical shape, among tangents to the hemisphere, there is a tangent parallel to the insulating layer. The point of contact of the tangent with the hemisphere is the vertex of the microlens. The vertex of the microlens can be determined in the same way for any cross-sectional view. That is, among the tangents to the semicircle of the microlens in the cross-sectional view, there is a tangent parallel to the insulating layer, and the point of contact of the tangent with the semicircle is the vertex of the microlens.

The midpoint of the microlens can be defined. In the cross section of the microlens, when a segment is hypothetically drawn from the point where an arc shape ends to the point where another arc shape ends, the midpoint of the segment can be referred to as the midpoint of the microlens. The cross section to determine the vertex and midpoint may be a cross section perpendicular to the insulating layer.

The microlens has a first surface having a convex portion and a second surface opposite to the first surface. The second surface can be disposed closer to the functional layer than the first surface. To form such a configuration, it is necessary to form a microlens on the light-emitting apparatus. When the functional layer is an organic layer, a high-temperature process can be avoided in the production process. When the second surface is closer to the functional layer than the first surface, the glass transition temperature of each organic compound constituting the organic layer is preferably 100° C. or higher, more preferably 130° C. or higher.

Opposite Substrate

An opposite substrate may be disposed on the planarization layer. The opposite substrate is disposed at a position corresponding to the substrate described above and thus is called an opposite substrate. The opposite substrate may be composed of the same material as the substrate described above. When the above-described substrate is referred to as a first substrate, the opposite substrate may be referred to as a second substrate.

Organic Layer

The organic compound layer, such as the hole injection layer, the hole transport layer, the electron-blocking layer, the light-emitting layer, the hole-blocking layer, the electron transport layer, or the electron injection layer, included in the organic light-emitting device according to an embodiment is formed by a method described below.

For the organic compound layer included in the organic light-emitting device according to an embodiment, a dry process, such as a vacuum evaporation method, an ionized evaporation method, sputtering, or plasma, may be employed. Alternatively, instead of the dry process, it is also possible to employ a wet process in which a material is dissolved in an appropriate solvent and then a film is formed by a known coating method, such as spin coating, dipping, a casting method, a Langmuir-Blodgett (LB) technique, or an ink jet method.

When the layer is formed by, for example, the vacuum evaporation method or the solution coating method, crystallization and so forth are less likely to occur, and good stability with time is obtained. In the case of forming a film by the coating method, the film may be formed in combination with an appropriate binder resin.

Non-limiting examples of the binder resin include poly (vinyl carbazole) resins, polycarbonate resins, polyester resins, acrylonitrile butadiene styrene (ABS) resins, acrylic resins, polyimide resins, phenolic resins, epoxy resins, silicone resins, and urea resins.

These binder resins may be used alone as a homopolymer or copolymer or in combination as a mixture of two or more. Furthermore, additives, such as a known plasticizer, antioxidant, and ultraviolet absorber, may be used, as needed.

Pixel Circuit

The light-emitting apparatus may include pixel circuits coupled to the light-emitting devices. Each of the pixel circuits may be of an active matrix type, which independently controls the emission of first and second light-emitting devices. The active matrix type circuit may be voltage programming or current programming. A driving circuit includes the pixel circuit for each pixel. The pixel circuit may include a light-emitting device, a transistor to control the luminance of the light-emitting device, a transistor to control the timing of the light emission, a capacitor to retain the gate voltage of the transistor to control the luminance, and a transistor to connect to GND without using the light-emitting device.

The light-emitting apparatus includes a display area and a peripheral area disposed around the display area. The display area includes a pixel circuit, and the peripheral area includes a display control circuit. The mobility of a transistor contained in the pixel circuit may be lower than the mobility of a transistor contained in the display control circuit.

The slope of the current-voltage characteristics of the transistor contained in the pixel circuit may be smaller than the slope of the current-voltage characteristic of the transistor contained in the display control circuit. The slope of the current-voltage characteristics can be measured by what is called Vg-Ig characteristics.

The transistor contained in the pixel circuit is a transistor coupled to a light-emitting device, such as a first light-emitting device.

Pixel

The organic light-emitting apparatus includes multiple pixels. Each pixel includes subpixels configured to emit colors different from each other. The subpixels may have respective red, green, and blue (RGB) emission colors.

Light emerges from a region of the pixel, also called a pixel aperture. This region may also be referred to as a first region.

The pixel aperture may be 15 μm or less, and may be 5 μm or more. More specifically, the pixel aperture may be, for example, 11 μm, 9.5 μm, 7.4 μm, or 6.4 μm.

The distance between subpixels may be 10 μm. Specifically, the distance may be 8 μm, 7.4 μm, or 6.4 μm.

The pixels may be arranged in a known configuration in plan view. For example, a stripe pattern, a delta pattern, a Pen Tile matrix pattern, or the Bayer pattern may be used. The shape of each subpixel in plan view may be any known shape. Examples of the shape of the subpixel include quadrilaterals, such as rectangles and rhombi, and hexagons. Of course, if the shape is close to a rectangle, rather than an exact shape, it is included in the rectangle. The shape of the subpixel and the pixel arrangement can be used in combination.

Application of Organic Light-Emitting Device According to Embodiments of the Disclosure The organic light-emitting device according to an embodiment can be used as a component member of a display apparatus or lighting apparatus. Other applications include exposure light sources for electrophotographic image-forming apparatuses, backlights for liquid crystal display apparatuses, and light-emitting apparatuses including white-light sources and color filters.

The display apparatus may be an image information-processing apparatus including an image input unit that receives image information from an area or linear CCD sensor, a memory card, or any other source, an information-processing unit that processes the input information, and a display unit that displays the input image.

The display unit of an image pickup apparatus or an inkjet printer may have a touch panel function. The driving mode of the touch panel function may be, but is not particularly limited to, an infrared mode, an electrostatic capacitance mode, a resistive film mode, or an electromagnetic inductive mode. The display apparatus may also be used for a display unit of a multifunction printer.

The following describes a display apparatus according to the present embodiment with reference to the attached drawings.

Figure 5A:
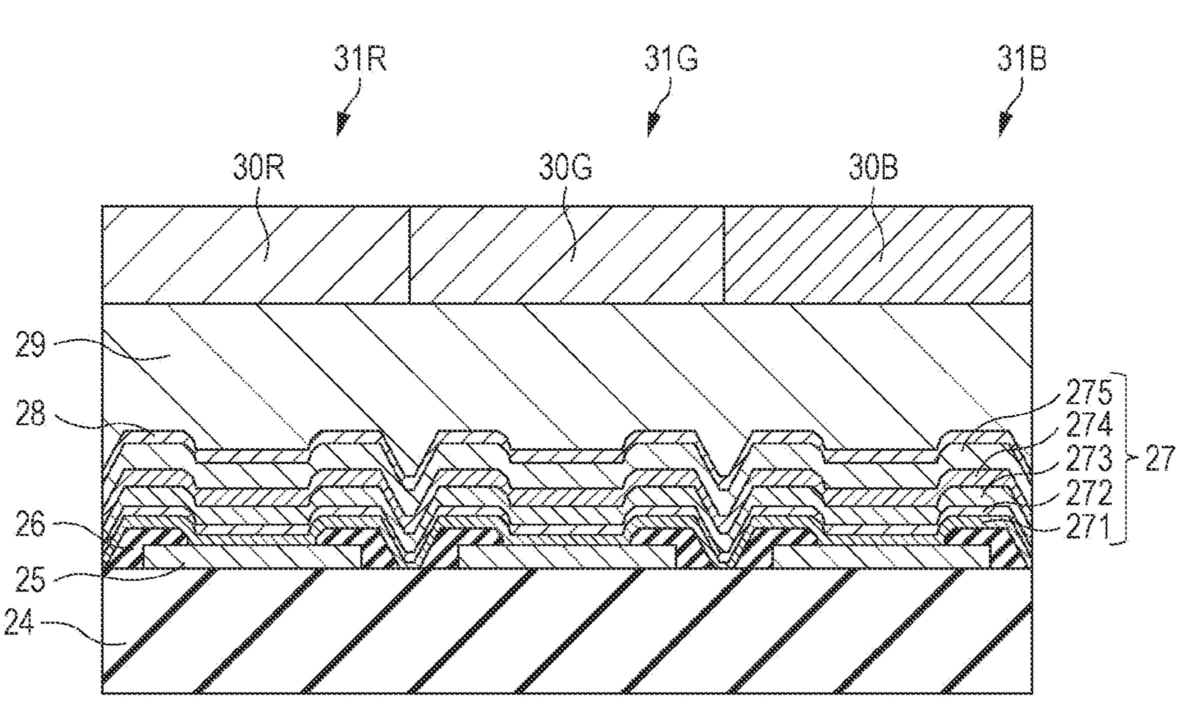
FIG. 5A is a schematic cross-sectional view of an example of a pixel of a display apparatus according to an embodiment.
Figure 5B:
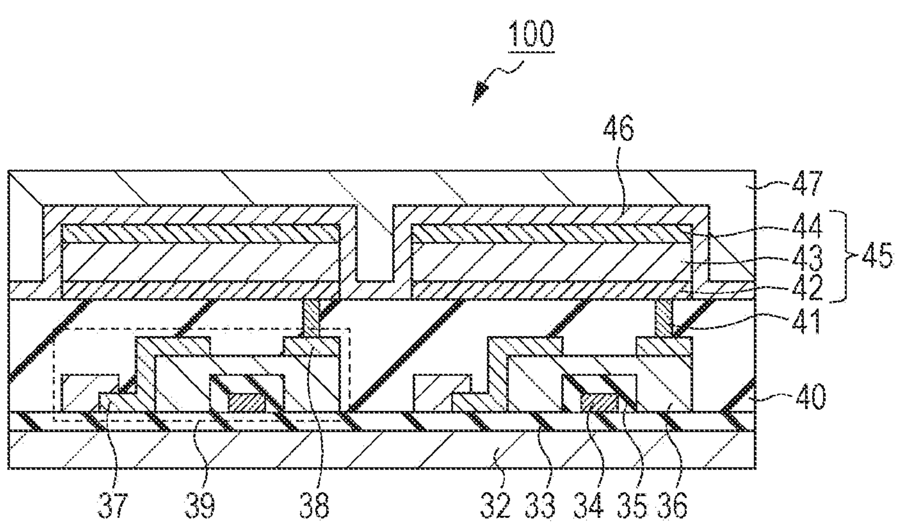
FIG. 5B is a schematic cross-sectional view of an example of a display apparatus including organic light-emitting devices according to an embodiment.

FIGS. 5A and 5B are each a schematic cross-sectional view of an example of a display apparatus including organic light-emitting devices and transistors coupled to the organic light-emitting devices. Each of the transistors is an example of an active element. The transistors may be thin-film transistors (TFTs).

FIG. 5A illustrates an example of pixels that are constitutional elements of the display apparatus according to the present embodiment. Each of the pixels includes subpixels 31. The subpixels are separated into 31R, 31G, and 31B according to their light emission. The emission colors may be distinguished by the wavelength of light emitted from the light-emitting layer. Light emitted from the subpixels may be selectively transmitted or color-converted with, for example, a color filter. Each subpixel includes a reflective electrode 25 serving as a first electrode, an insulating layer 26 covering the edge of the reflective electrode 25, an organic compound layer 27 covering the first electrode and the insulating layer, a transparent electrode 28, a protective layer 29, and a color filter 30, over an interlayer insulating layer 24.

The transistors and capacitive elements may be disposed under or in the interlayer insulating layer 24. Each transistor may be electrically coupled to a corresponding one of the first electrodes through a contact hole (not illustrated).

The insulating layer 26 is also called a bank or pixel separation film. The insulating layer 26 covers the edge of each first electrode and surrounds the first electrode. Portions that are not covered with the insulating layer are in contact with the organic compound layer 27 and serve as light-emitting regions.

The organic compound layer 27 includes a hole injection layer 271, a hole transport layer 272, a first light-emitting layer 273, a second light-emitting layer 274, and an electron transport layer 275.

The second electrode 28 may be a transparent electrode, a reflective electrode, or a semi-transparent electrode.

The protective layer 29 reduces the penetration of moisture into the organic compound layer. Although the protective layer is illustrated as a single layer, the protective layer may be formed of multiple layers. Each layer may be an inorganic compound layer or an organic compound layer.

The color filter 30 is separated into 30R, 30G, and 30B according to its color. The color filter may be disposed on a planarization film (not illustrated). A resin protective layer (not illustrated) may be disposed on the color filter. The color filter may be disposed on the protective layer 29. Alternatively, the color filter may be disposed on an opposite substrate, such as a glass substrate, and then bonded.

A display apparatus 100 illustrated in FIG. 5B includes organic light-emitting devices 45 and TFTs 39 as an example of transistors. A substrate 32 composed of a material, such as glass or silicon, is provided, and an insulating layer 33 is disposed thereon. Active elements, such as the TFTs 39, are arranged on the insulating layer. A gate electrode 34, a gate insulating film 35, and a semiconductor layer 36 of each of the active elements are arranged on the insulating layer. Each TFT 39 includes the semiconductor layer 36, a drain electrode 38, and a source electrode 37. An insulating film 40 is disposed on the TFTs 39. Anodes 42 included in the organic light-emitting devices 45 are coupled to the drain electrodes 38 through contact holes 41 provided in the insulating film. The drain electrode and the source electrode may be interchanged in accordance with the polarity of the transistor.

The mode of electrical connection between the electrodes (anode and cathode) included in each organic light-emitting device 45 and the electrodes (source electrode and drain electrode) included in a corresponding one of the TFTs is not limited to the mode illustrated in FIG. 5B. That is, it is sufficient that any one of the anode and the cathode is electrically coupled to any one of the source electrode and the drain electrode of the TFT. The term "TFT" refers to a thin-film transistor.

In the display apparatus 100 illustrated in FIG. 5B, each organic compound layer is illustrated as a single layer; however, the organic compound layer 43 may be formed of multiple layers. To reduce the deterioration of the organic light-emitting devices, a first protective layer 46 and a second protective layer 47 are disposed over the cathodes 44.

In the display apparatus 100 illustrated in FIG. 5B, although the transistors are used as switching elements, other switching elements may be used instead.

The transistors used in the display apparatus 100 illustrated in FIG. 5B are not limited to transistors using a single-crystal silicon wafer, but may also be thin-film transistors including active layers on the insulating surface of a substrate. Examples of the material of the active layer include single-crystal silicon, non-single-crystal silicon materials, such as amorphous silicon and microcrystalline silicon, and non-single-crystal oxide semiconductors, such as indium-zinc oxide and indium-gallium-zinc oxide. Thin-film transistors are also called TFT elements.

The transistors in the display apparatus 100 illustrated in FIG. 5B may be formed in the substrate, such as a Si substrate. The expression "formed in the substrate" indicates that the transistors are produced by processing the substrate such as a Si substrate. In the case where the transistors are formed in the substrate, the substrate and the transistors can be deemed to be integrally formed.

In the organic light-emitting device according to the present embodiment, the luminance is controlled by the TFTs, which are an example of switching elements; thus, an image can be displayed at respective luminance levels by arranging multiple organic light-emitting devices in the plane. The switching elements according to the embodiment are not limited to the TFT elements and may be low-temperature polysilicon transistors or active-matrix drivers formed on a substrate such as a Si substrate. The expression "on a substrate" can also be said to be "in the substrate". Whether transistors are formed in the substrate or TFTs are used is selected in accordance with the size of a display unit. For example, in the case where the display unit has a size of about 0.5 inches, organic light-emitting devices can be disposed on a Si substrate.

Figure 6:
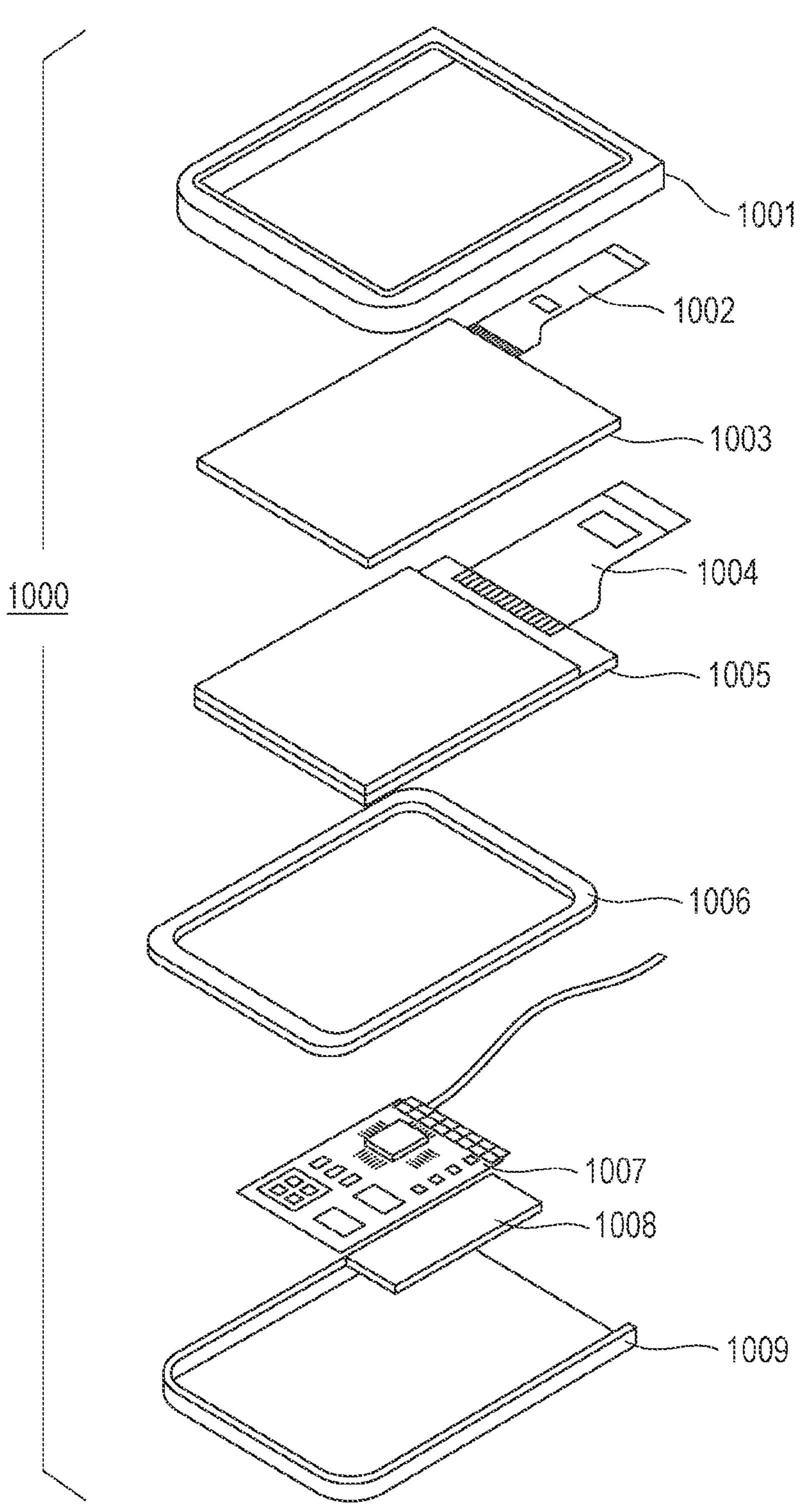
FIG. 6 is a schematic view of an example of a display apparatus according to an embodiment.

FIG. 6 is a schematic view illustrating an example of a display apparatus according to an embodiment. A display apparatus 1000 may include a touch panel 1003, a display panel 1005, a frame 1006, a circuit board 1007, and a battery 1008 disposed between an upper cover 1001 and a lower cover 1009. The touch panel 1003 and the display panel 1005 are coupled to flexible printed circuits FPCs 1002 and 1004, respectively. The circuit board 1007 includes printed transistors. The battery 1008 need not be provided unless the display apparatus is a portable apparatus. The battery 1008 may be disposed at a different position even if the display apparatus is a portable apparatus.

The display apparatus according to the present embodiment may include a color filter having red, green, and blue portions. In the color filter, the red, green, and blue portions may be arranged in a delta arrangement.

The display apparatus according to the present embodiment may be used for the display unit of a portable terminal. In that case, the display apparatus may have both a display function and an operation function. Examples of the portable terminal include mobile phones such as smartphones, tablets, and head-mounted displays.

The display apparatus according to the present embodiment may be used for a display unit of an image pickup apparatus including an optical unit including multiple lenses and an image pickup device that receives light passing through the optical unit. The image pickup apparatus may include a display unit that displays information acquired by the image pickup device. The display unit may be a display unit exposed to the outside of the image pickup apparatus or a display unit disposed in a finder. The image pickup apparatus may be a digital camera or a digital camcorder.

Figure 7A:
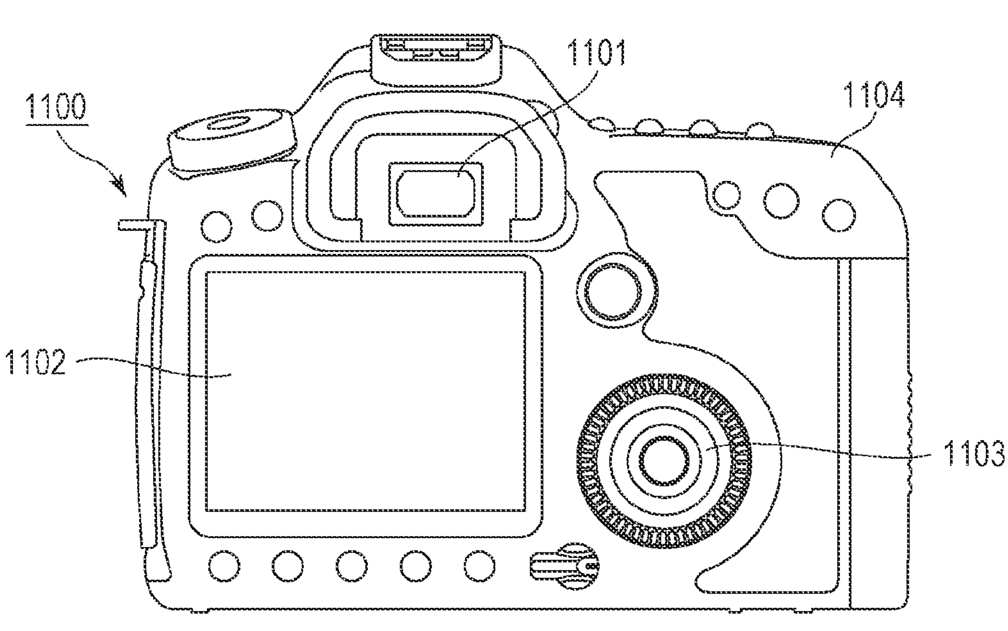
FIG. 7A is a schematic view of an example of an image pickup apparatus according to an embodiment.

FIG. 7A is a schematic view illustrating an example of an image pickup apparatus according to the present embodiment. An image pickup apparatus 1100 may include a viewfinder 1101, a rear display 1102, an operation unit 1103, and a housing 1104. The viewfinder 1101 may include the display apparatus according to the present embodiment. In this case, the display apparatus may display environmental information, imaging instructions, and so forth in addition to an image to be captured. The environmental information may include, for example, the intensity of external light, the direction of external light, the moving speed of a subject, and the possibility that a subject is shielded by a shielding material.

The timing appropriate for imaging is only for a short time; thus, the information may be displayed as soon as possible. Thus, a display apparatus including the organic light-emitting device according to an embodiment can be used. This is because the organic light-emitting device has a high response speed. The display apparatus including the organic light-emitting device can be used more appropriately than liquid crystal display apparatuses for such apparatuses required to have a high display speed.

The image pickup apparatus 1100 includes an optical unit (not illustrated). The optical unit includes multiple lenses and is configured to form an image on an image pickup device in the housing 1104. The relative positions of the multiple lenses can be adjusted to adjust the focal point. This operation can also be performed automatically. The image pickup apparatus may be referred to as a photoelectric conversion apparatus. Examples of an image capturing method employed in the photoelectric conversion apparatus may include a method for detecting a difference from the previous image and a method of cutting out an image from images always recorded, instead of sequentially capturing images.

Figure 7B:
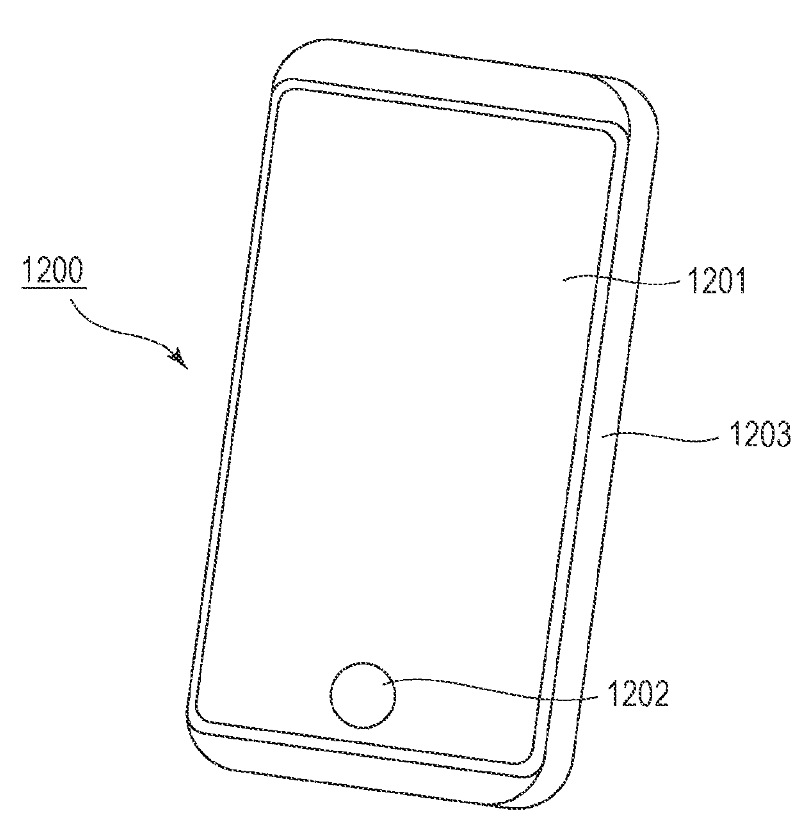
FIG. 7B is a schematic view of an example of an electronic apparatus according to an embodiment.

FIG. 7B is a schematic view illustrating an example of an electronic apparatus according to the present embodiment. An electronic apparatus 1200 includes a display unit 1201, an operation unit 1202, and a housing 1203. The housing 1203 may accommodate a circuit, a printed circuit board including the circuit, a battery, and a communication unit. The operation unit 1202 may be a button or a touch-panel-type reactive unit. The operation unit may be a biometric recognition unit that recognizes a fingerprint to release the lock or the like. An electronic apparatus including a communication unit can also be referred to as a communication apparatus. The electronic apparatus may further have a camera function by being equipped with a lens and an image pickup device. An image captured by the camera function is displayed on the display unit. Examples of the electronic apparatus include smartphones and notebook computers.

Figure 8A:
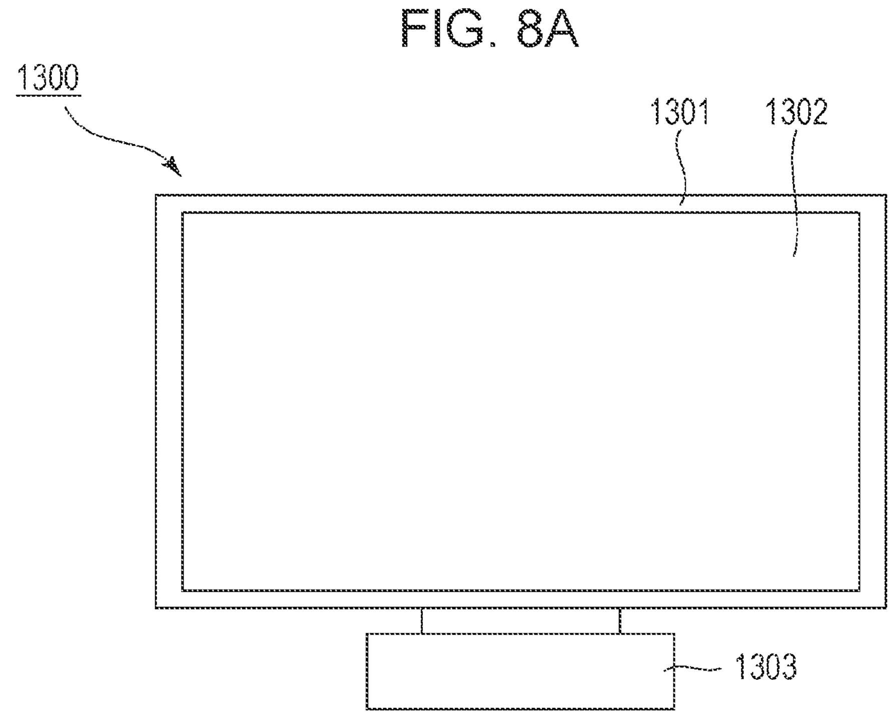
FIG. 8A is a schematic view of an example of a display apparatus according to an embodiment.
Figure 8B:
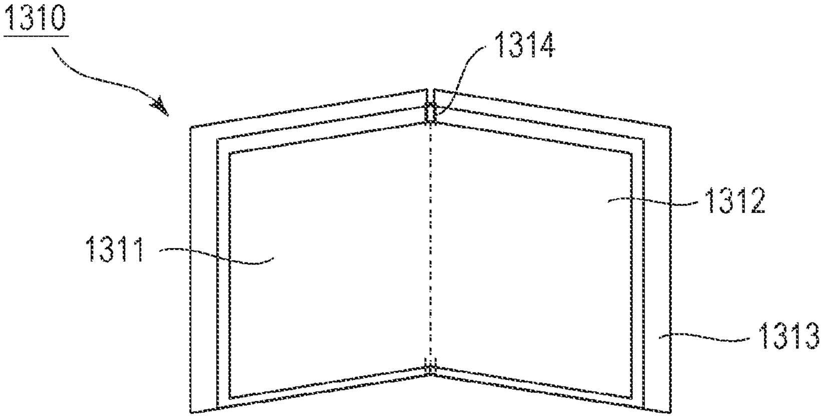
FIG. 8B is a schematic view of an example of a foldable display apparatus.

FIGS. 8A and 8B are each a schematic view illustrating an example of a display apparatus according to the present embodiment. FIG. 8A illustrates a display apparatus, such as a television monitor or a PC monitor. A display apparatus 1300 includes a frame 1301 and a display unit 1302. The display unit 1302 may include a light-emitting apparatus according to the present embodiment.

The display apparatus 1300 includes a base 1303 that supports the frame 1301 and the display unit 1302. The base 1303 is not limited to the structure illustrated in FIG. 8A. The lower side of the frame 1301 may also serve as a base.

The frame 1301 and the display unit 1302 may be curved. These may have a radius of curvature of 5,000 mm or more and 6,000 mm or less.

FIG. 8B is a schematic view illustrating another example of a display apparatus according to the present embodiment. A display apparatus 1310 illustrated in FIG. 8B can be folded and is what is called a foldable display apparatus. The display apparatus 1310 includes a first display portion 1311, a second display portion 1312, a housing 1313, and an inflection point 1314. The first display portion 1311 and the second display portion 1312 may include a light-emitting apparatus according to the present embodiment. The first display portion 1311 and the second display portion 1312 may be a single, seamless display apparatus. The first display portion 1311 and the second display portion 1312 can be divided from each other at the inflection point. The first display portion 1311 and the second display portion 1312 may display different images from each other. Alternatively, a single image may be displayed in the first and second display portions.

Figure 9A:
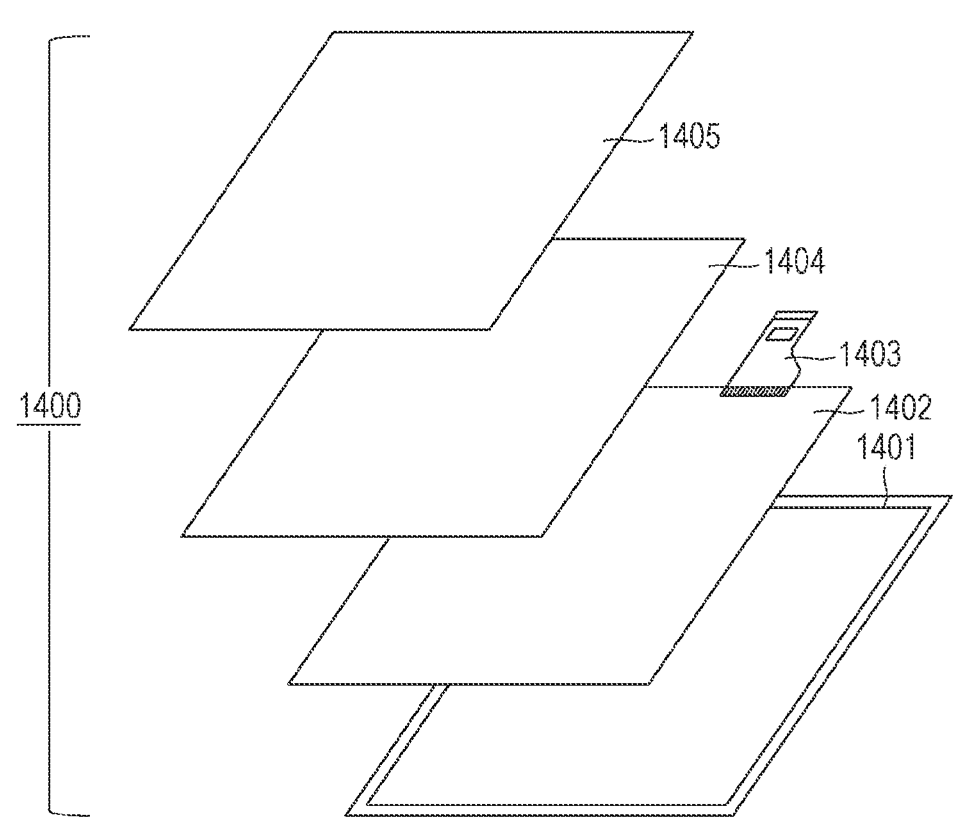
FIG. 9A is a schematic view of an example of a lighting apparatus according to an embodiment.

FIG. 9A is a schematic view illustrating an example of a lighting apparatus according to the present embodiment. A lighting apparatus 1400 may include a housing 1401, a light source 1402, a circuit board 1403, an optical film 1404, and a light diffusion unit 1405. The light source may include an organic light-emitting device according to the present embodiment. The optical filter may be a filter that improves the color rendering properties of the light source. The light diffusion unit can effectively diffuse light from the light source to deliver the light to a wide range when used for illumination and so forth. The optical filter and the light diffusion unit may be disposed at the light emission side of the lighting device. A cover may be disposed at the outermost portion, as needed.

The lighting apparatus is, for example, an apparatus that lights a room. The lighting apparatus may emit light of white, neutral white, or any color from blue to red. A light control circuit that controls the light may be provided.

The lighting apparatus may include the organic light-emitting device according to an embodiment and a power supply circuit coupled thereto. The power supply circuit is a circuit that converts an AC voltage into a DC voltage. The color temperature of white is 4,200 K, and the color temperature of neutral white is 5,000 K. The lighting apparatus may include a color filter.

The lighting apparatus according to the present embodiment may include a heat dissipation unit. The heat dissipation unit is configured to release heat in the apparatus to the outside of the apparatus and is composed of, for example, a metal having a high specific heat and liquid silicone.

Figure 9B:
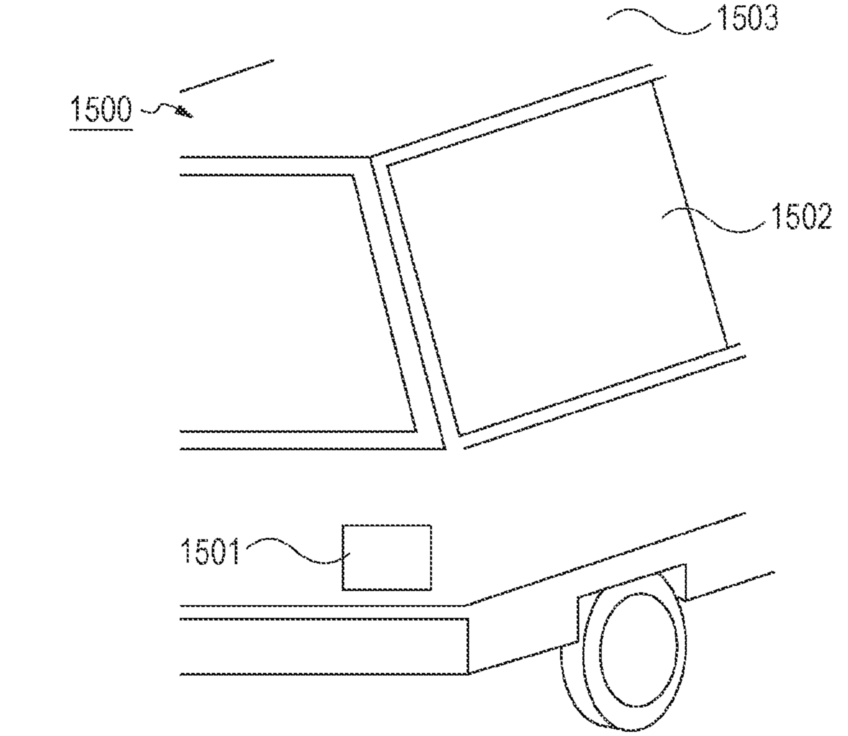
FIG. 9B is a schematic view of an example of an automobile including an automotive lighting unit according to an embodiment.

FIG. 9B is a schematic view illustrating an automobile, as an example of a moving object, according to the present embodiment. The automobile includes a tail lamp, which is an example of lighting units. An automobile 1500 includes a tail lamp 1501 and may be configured to light the tail lamp when a brake operation or the like is performed.

The tail lamp 1501 may include an organic light-emitting device according to the present embodiment. The tail lamp 1501 may include a protective member that protects the organic light-emitting device. The protective member may be composed of any transparent material having high strength to some extent and can be composed of, for example, polycarbonate. The polycarbonate may be mixed with, for example, a furandicarboxylic acid derivative or an acrylonitrile derivative.

The automobile 1500 may include an automobile body 1503 and windows 1502 attached thereto. The windows may be transparent displays if the windows are not used to check the front and back of the automobile. The transparent displays may include an organic light-emitting device according to the present embodiment. In this case, the components, such as the electrodes, of the organic light-emitting device are formed of transparent members.

The moving object according to the present embodiment may be, for example, a ship, an aircraft, or a drone. The moving object may include a body and a lighting unit attached to the body. The lighting unit may emit light to indicate the position of the body. The lighting unit includes the organic light-emitting device according to the present embodiment.

Examples of applications of the display apparatuses of the above embodiments will be described with reference to FIGS. 10A and 10B. A display apparatus according to the present embodiment includes an organic light-emitting apparatus, a projection unit configured to project light emitted from the organic light-emitting apparatus, and a light guide unit configured to guide light from the organic light-emitting apparatus to the projection unit. The display apparatus can be used for systems that can be worn as wearable devices, such as smart glasses, head-mounted displays (HMDs), and smart contact lenses. An image pickup and display apparatus used in such an application has an image pickup apparatus that can photoelectrically convert visible light and a display apparatus that can emit visible light.

Figure 10A:
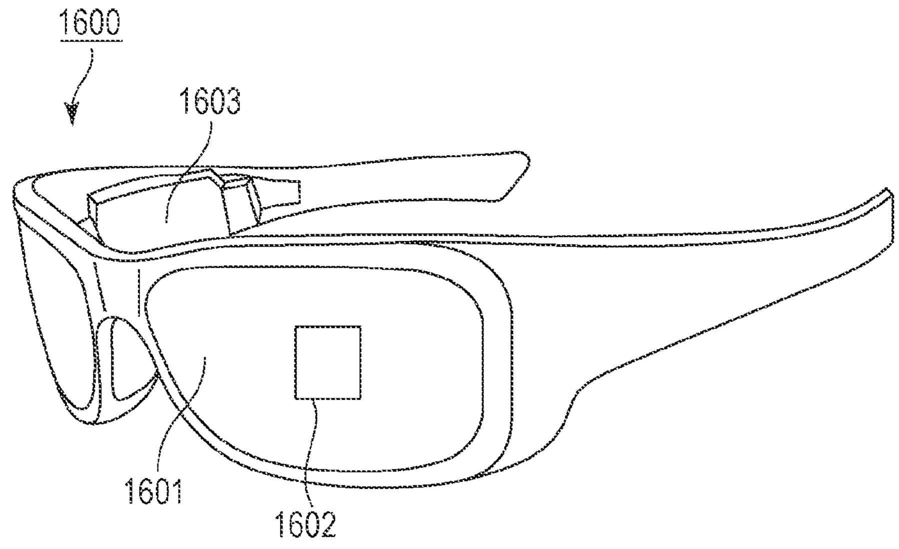
FIG. 10A is a schematic view of an example of a wearable device according to an embodiment.

FIG. 10A illustrates glasses 1600 (smart glasses) according to an example of applications. An image pickup apparatus 1602, such as a complementary metal-oxide semiconductor (CMOS) sensor or a single-photon avalanche diode (SPAD), is provided on a front side of a lens 1601 of the glasses 1600. The display apparatus according to any of the above-mentioned embodiments is provided on the back side of the lens 1601. That is, the lens can also be referred to as a display unit.

The glasses 1600 further include a control unit 1603. The control unit 1603 functions as a power source that supplies electric power to the image pickup apparatus 1602 and the display apparatus according to any of the embodiments. The control unit 1603 controls the operation of the image pickup apparatus 1602 and the display apparatus. The image pickup apparatus 1602 may be provided with an optical system for collecting light.

Figure 10B:
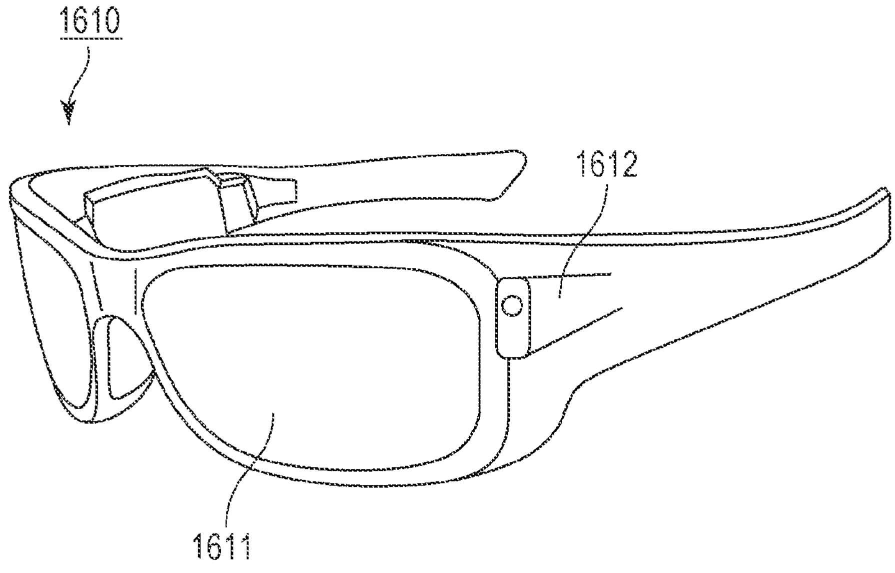
FIG. 10B is a schematic view of an example of a wearable device according to an embodiment, the wearable device including an image pickup apparatus.

FIG. 10B illustrates glasses 1610 (smart glasses) according to an example of applications. The glasses 1610 include a control unit 1612. The control unit 1612 includes an image pickup apparatus corresponding to the image pickup apparatus 1602 and a display apparatus. An image displayed by the display apparatus in the control unit 1612 is projected onto the lens 1611. An optical system for guiding light emitted from the display apparatus to the lens 1611 may be provided. The optical system can totally reflect and guide the light from the display apparatus to the lens. The control unit 1612 functions as a power source that supplies electric power to the image pickup apparatus and the display apparatus and controls the operation of the image pickup apparatus and the display apparatus. The control unit may include a gaze detection unit that detects the gaze of a wearer. Infrared radiation may be used for gaze detection. An infrared light-emitting unit emits infrared light to an eyeball of a user who is gazing at a displayed image. An image of the eyeball is captured by detecting the reflected infrared light from the eyeball with an image pickup unit having light-receiving elements. The deterioration of image quality is reduced by providing a reduction unit configured to reduce light from the infrared light-emitting unit to the display unit when viewed in plan.

The user's gaze at the displayed image is detected from the image of the eyeball captured with the infrared light. Any known method can be used to the gaze detection using the captured image of the eyeball. As an example, a gaze detection method based on a Purkinje image of the reflection of irradiation light on a cornea can be used.

More specifically, the gaze detection process is based on a pupil-corneal reflection method. Using the pupil-corneal reflection method, the user's gaze is detected by calculating a gaze vector representing the direction (rotation angle) of the eyeball based on the image of the pupil and the Purkinje image contained in the captured image of the eyeball.

A display apparatus according to an embodiment may include an image pickup apparatus including light-receiving elements, and may control an image displayed on the display apparatus based on the gaze information of the user from the image pickup apparatus.

Specifically, in the display apparatus, a first field-of-view area at which the user gazes and a second field-of-view area other than the first field-of-view area are determined on the basis of the gaze information. The first field-of-view area and the second field-of-view area may be determined by the control unit of the display apparatus or may be determined by receiving those determined by an external control unit. In the display area of the display apparatus, the display resolution of the first field-of-view area may be controlled to be higher than the display resolution of the second field-of-view area. That is, the resolution of the second field-of-view area may be lower than that of the first field-of-view area.

The display area includes a first display area and a second display area different from the first display area. Based on the gaze information, an area of higher priority is determined from the first display area and the second display area. The first display area and the second display area may be determined by the control unit of the display apparatus or may be determined by receiving those determined by an external control unit. The resolution of an area of higher priority may be controlled to be higher than the resolution of an area other than the area of higher priority. In other words, the resolution of an area of a relatively low priority may be low.

Artificial intelligence (AI) may be used to determine the first field-of-view area or the high-priority area. The AI may be a model configured to estimate the angle of gaze from the image of the eyeball and the distance to a target object located in the gaze direction, using the image of the eyeball and the actual direction of gaze of the eyeball in the image as teaching data. The AI program may be stored in the display apparatus, the image pickup apparatus, or an external apparatus. When the AI program is stored in the external apparatus, the AI program is transmitted to the display apparatus via communications.

In the case of controlling the display based on visual detection, smart glasses that further include an image pickup apparatus that captures an external image can be used. The smart glasses can display the captured external information in real time.

Figure 11A:
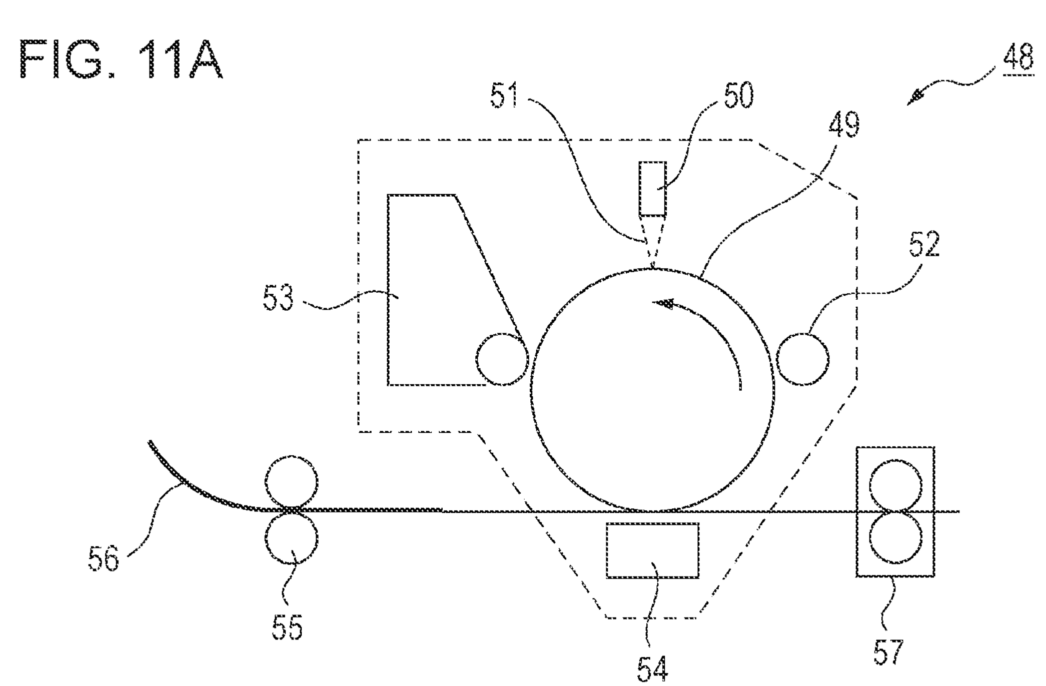
FIG. 11A is a schematic view of an image-forming apparatus according to an embodiment.
Figure 11B:
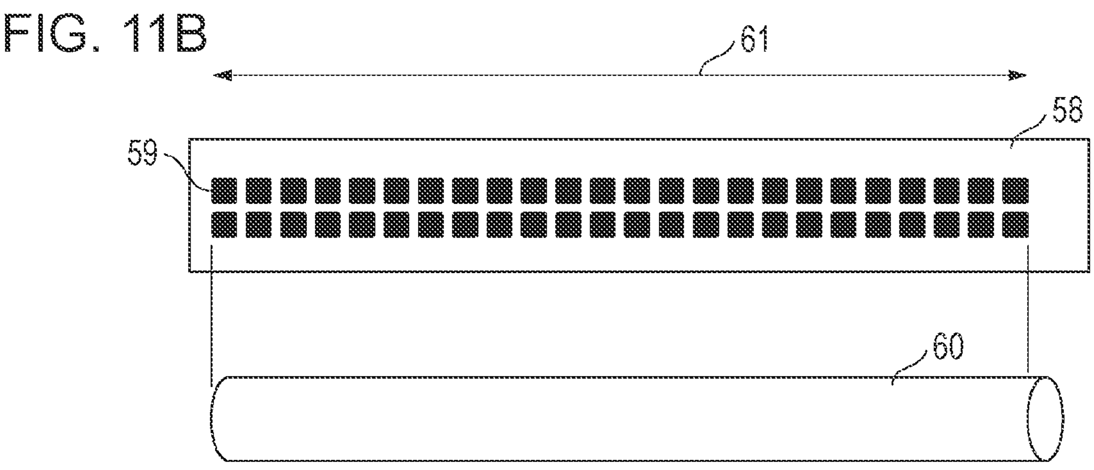
FIGS. 11B and 11C are schematic views each illustrating a configuration of an exposure light source including multiple light-emitting portions arranged on a long substrate.
Figure 11C:
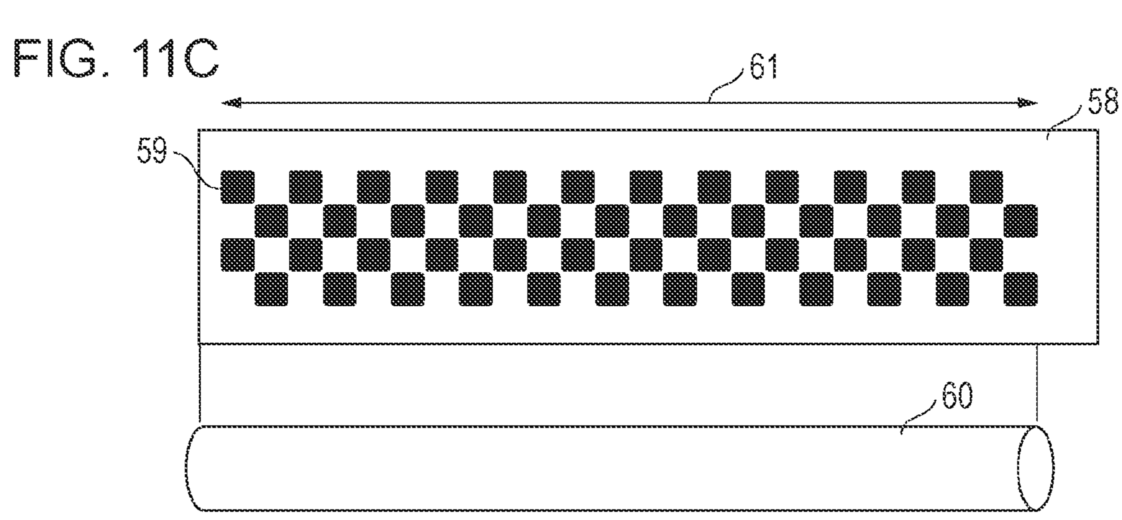

FIGS. 11A, 11B, and 11C are each a schematic view of an image-forming apparatus according to an embodiment. FIG. 11A is a schematic view of an image-forming apparatus 48 according to an embodiment. The image-forming apparatus includes a photoconductor, an exposure light source, a developing unit, a charging unit, a transfer unit, a transport roller, and a fusing unit.

The irradiation of light 51 is performed from the exposure light source 50 to form an electrostatic latent image on the surface of the photoconductor 49. This exposure light source includes an organic light-emitting device according to an embodiment. The developing unit 53 contains, for example, a toner. The charging unit 52 charges the photoconductor. The transfer unit 54 transfers the developed image to a recording medium 56. The transport roller 55 transports the recording medium 56. The recording medium 56 is paper, for example. The fusing unit 57 fixes the image formed on the recording medium.

FIGS. 11B and 11C are each a schematic view illustrating a state in which multiple light-emitting portions 59 are arranged on a long substrate in the exposure light source 58. Arrows 61 are parallel to the axis of the photoconductor and each represent the row direction in which the organic light-emitting devices are arranged. The row direction is the same as the direction of the axis on which the photoconductor 60 rotates. This direction can also be referred to as the long-axis direction of the photoconductor.

FIG. 11B illustrates a configuration in which the light-emitting portions are arranged in the long-axis direction of the photoconductor. FIG. 11C is different from FIG. 11B in that the light-emitting portions are arranged alternately in the row direction in a first row and a second row. The first row and the second row are located at different positions in the column direction.

In the first row, the multiple light-emitting portions are spaced apart. The second row has the light-emitting portions at positions corresponding to the positions between the light-emitting portions in the first row. In other words, the multiple light-emitting portions are also spaced apart in the column direction.

The arrangement in FIG. 11C can be rephrased as, for example, a lattice arrangement, a staggered arrangement, or a checkered pattern.

As described above, the use of an apparatus including the organic light-emitting device according to the present embodiment enables a stable display with good image quality even for a long time.

Configuration

The following configuration can be achieved using the organic light-emitting device or the organic light-emitting apparatus according to an embodiment.

According to an embodiment, it is possible to provide an organic light-emitting device having two light-emitting layers configured to emit light of a first color and having excellent light emission characteristics.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-164886, filed Oct. 13, 2022, and No. 2023-109523, filed Jul. 3, 2023, which are hereby incorporated by reference herein in their entirety.

What is claimed is:

1. An organic light-emitting apparatus, comprising:

a first organic light-emitting device and a second organic light-emitting device, wherein the first organic light-emitting device comprises, in the following order:

a first electrode;

a first light-emitting layer;

a charge generation layer;

a second light-emitting layer; and a second electrode, the first light-emitting layer contains a first light-emitting material, the second light-emitting layer contains a second light-emitting material, each of the first light-emitting material and the second light-emitting material emits light of a first color, wherein the second organic light-emitting device comprises, in the following order:

a third electrode, a third light-emitting layer, a second charge generation layer, a fourth light-emitting layer, and a fourth electrode, the third light-emitting layer contains a third light-emitting material, the fourth light-emitting layer contains a fourth light-emitting material, and each of the third light-emitting material and the fourth light-emitting material emits light of a second color different from the first color, and wherein the first light-emitting material and the second light-emitting material are different.

2. The organic light-emitting apparatus according to claim 1, wherein a full width at half maximum of a photoluminescence spectrum of the first light-emitting material is different from a full width at half maximum of a photoluminescence spectrum of the second light-emitting material.

3. The organic light-emitting apparatus according to claim 2, wherein the full width at half maximum of the photoluminescence spectrum of the first light-emitting material is larger than the full width at half maximum of the photoluminescence spectrum of the second light-emitting material.

4. The organic light-emitting apparatus according to claim 2, wherein the full width at half maximum of the photoluminescence spectrum of the first light-emitting material is smaller than the full width at half maximum of the photoluminescence spectrum of the second light-emitting material.

5. The organic light-emitting apparatus according to claim 2, wherein a difference between the full width at half maximum of the photoluminescence spectrum of the first light-emitting material and the full width at half maximum of the photoluminescence spectrum of the second light-emitting material is within 30 nm.

6. The organic light-emitting apparatus according to claim 1, wherein a distance between the first electrode and the first light-emitting layer is a first optical distance that intensifies light having a wavelength of the first color, and a distance between the first electrode and the second light-emitting layer is a second optical distance that intensifies the light having the wavelength of the first color and has an order different from the first optical distance.

7. The organic light-emitting apparatus according to claim 1, wherein a lowest unoccupied molecular orbital energy level of the charge generation layer is lower than a highest occupied molecular orbital energy level of the second light-emitting layer.

8. The organic light-emitting apparatus according to claim 1, further comprising a reflective electrode, wherein the first organic light-emitting device comprises, in the following order:

the reflective electrode, the first electrode, the first light-emitting layer, the second light-emitting layer, and the second electrode, wherein a distance between the reflective electrode and the first light-emitting layer is a first optical distance that intensifies light having a wavelength of the first color, and a distance between the reflective electrode and the second light-emitting layer is a second optical distance that intensifies the light having the wavelength of the first color and has an order different from the first optical distance.

9. The organic light-emitting apparatus according to claim 1, wherein an orthogonal projection of the second light-emitting layer on the first electrode is larger than an orthogonal projection of the first light-emitting layer on the first electrode.

10. The organic light-emitting apparatus according to claim 1, further comprising a lens on which light emitted from the first light-emitting layer is incident, wherein the second light-emitting layer is disposed between the lens and the first light-emitting layer.

11. The organic light-emitting apparatus according to claim 1, further comprising:

a first hole transport layer between the first electrode and the first light-emitting layer; and a second hole transport layer between the charge generation layer and the second light-emitting layer, wherein a lowest unoccupied molecular orbital energy level of the first hole transport layer is higher than a lowest unoccupied molecular orbital energy level of the first light-emitting layer, a lowest unoccupied molecular orbital energy level of the second hole transport layer is higher than a lowest unoccupied molecular orbital energy level of the second light-emitting layer, and a difference in lowest unoccupied molecular orbital energy level between the first hole transport layer and the first light-emitting layer is larger than a difference in lowest unoccupied molecular orbital energy level between the second hole transport layer and the second light-emitting layer.

12. The organic light-emitting apparatus according to claim 1, further comprising:

a first electron transport layer between the first light-emitting layer and the charge generation layer; and a second electron transport layer between the second light-emitting layer and the second electrode, wherein a highest occupied molecular orbital energy level of the first electron transport layer is lower than a highest occupied molecular orbital energy level of the first light-emitting layer, a highest occupied molecular orbital energy level of the second electron transport layer is lower than a highest occupied molecular orbital energy level of the second light-emitting layer, and a difference in highest occupied molecular orbital energy level between the second electron transport layer and the second light-emitting layer is larger than a difference in highest occupied molecular orbital energy level between the first electron transport layer and the first light-emitting layer.

13. The organic light-emitting apparatus according to claim 1, wherein the first electrode is electrically coupled to a driving circuit, and the first light-emitting material is a thermally activated delayed fluorescence material.

14. The organic light-emitting apparatus according to claim 1, wherein the third light-emitting material and the fourth light-emitting material are the same material.

15. The organic light-emitting apparatus according to claim 1, wherein the third light-emitting material and the fourth light-emitting material are different materials.

16. The organic light-emitting apparatus according to claim 1, wherein a wavelength of the light of the second color is longer than a wavelength of the light of the first color.

17. The organic light-emitting apparatus according to claim 1, wherein a wavelength of the light of the second color is shorter than a wavelength of the light of the first color.

18. The organic light-emitting apparatus according to claim 1, wherein the first organic light-emitting device comprises a first lens, and the second organic light-emitting device comprises a second lens, the second light-emitting layer is disposed between the first lens and the first light-emitting layer, and the fourth light-emitting layer is disposed between the second lens and the third light-emitting layer.

19. The organic light-emitting apparatus according to claim 18, wherein in a cross section perpendicular to a surface of the first electrode in contact with a first organic compound layer including the first light-emitting layer, a midpoint of the first electrode of the first organic light-emitting device does not coincide with a vertex of the first lens in plan view.

20. The organic light-emitting apparatus according to claim 19, wherein in the cross section perpendicular to the surface of the first electrode in contact with the first organic compound layer, a midpoint of the third electrode of the second organic light-emitting device does not coincide with a vertex of the second lens in plan view, and a distance between the midpoint of the first electrode of the first organic light-emitting device and the vertex of the first lens is different from a distance between the midpoint of the third electrode and the vertex of the second lens.

21. A display apparatus, comprising:

multiple pixels, at least one of the multiple pixels including:

the organic light-emitting apparatus according to claim 1, and a transistor coupled to the organic light-emitting apparatus.

22. An image pickup apparatus, comprising:

an optical unit including multiple lenses;

an image pickup device configured to receive light passing through the optical unit; and a display unit configured to display an image captured by the image pickup device, wherein the display unit includes the organic light-emitting apparatus according to claim 1.

23. An electronic apparatus, comprising:

a display unit including the organic light-emitting apparatus according to claim 1;

a housing provided with the display unit; and a communication unit disposed in the housing and communicating with outside.

* * * * *